(12) United States Patent
Moriguchi et al.

(10) Patent No.: US 7,148,567 B2
(45) Date of Patent: Dec. 12, 2006

(54) SEMICONDUCTOR INTEGRATED CIRCUIT DEVICE

(75) Inventors: Yasuo Moriguchi, Tokyo (JP); Shintaro Mori, Tokyo (JP); Fumihiko Terayama, Tokyo (JP); Hirokazu Komoriya, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/078,585

(22) Filed: Mar. 14, 2005

(65) Prior Publication Data
US 2005/0156305 A1 Jul. 21, 2005

Related U.S. Application Data

(63) Continuation of application No. 10/160,189, filed on Jun. 4, 2002, now abandoned.

(30) Foreign Application Priority Data
Dec. 3, 2001 (JP) .............................. 2001-369085

(51) Int. Cl.
H01L 23/34 (2006.01)
H01L 23/52 (2006.01)
H01L 25/16 (2006.01)

(52) U.S. Cl. .................. 257/723; 257/724; 257/784; 257/E25.031; 257/E25.032

(58) Field of Classification Search ........ 257/723–724, 257/694–695, 784, E25.031, E25.032, E23.042
See application file for complete search history.

(56) References Cited

U.S. PATENT DOCUMENTS

| | | | |
|---|---|---|---|
| 5,096,852 A | | 3/1992 | Hobson |
| 5,362,984 A | * | 11/1994 | Konda et al. ................ 257/666 |
| 5,373,188 A | * | 12/1994 | Michii et al. ................ 257/666 |
| 5,552,966 A | | 9/1996 | Nagano |
| 5,625,235 A | * | 4/1997 | Takiar .......................... 257/776 |
| 5,789,816 A | * | 8/1998 | Wu .............................. 257/723 |
| 5,936,303 A | | 8/1999 | Nishi |
| 6,159,765 A | * | 12/2000 | Drehobl et al. ............. 438/106 |
| 6,291,881 B1 | | 9/2001 | Yang |
| 6,320,201 B1 | | 11/2001 | Corbett et al. |
| 6,441,501 B1 | * | 8/2002 | Tseng et al. ................. 257/784 |
| 6,602,735 B1 | | 8/2003 | Shyu |

FOREIGN PATENT DOCUMENTS

| | | |
|---|---|---|
| JP | 60-030152 | 2/1985 |
| JP | 61-073359 | 4/1986 |
| JP | 04-349655 | 4/1992 |
| JP | 05-343609 | 12/1993 |
| JP | 06151685 | 5/1994 |

(Continued)

OTHER PUBLICATIONS

Japanese Office Action, with English-language translation, dated Jul. 13, 2006.

(Continued)

Primary Examiner—Luan Thai
(74) Attorney, Agent, or Firm—Buchanan Ingersoll & Rooney PC

(57) ABSTRACT

A semiconductor integrated circuit device has two semiconductor integrated circuit chips (20 and 30) respectively provided with a plurality of PADs (40a–40e, 41a–41e and 42a–42d), a plurality of LEADs (50a–50d) disposed around arrays of the semiconductor integrated circuit chips, and a plurality of bonding wires (60a–60e and 61a–61d). The plurality of bonding wires are connected so as not to straddle one semiconductor integrated circuit chip (30) and allow wiring between the PADs (40a–40e) of the other semiconductor integrated circuit chip (20) and the LEADs (50a–50d).

3 Claims, 14 Drawing Sheets

FOREIGN PATENT DOCUMENTS

| | | |
|---|---|---|
| JP | 06-177321 | 6/1994 |
| JP | 06-232196 | 8/1994 |
| JP | 10-032306 | 2/1998 |
| JP | 10-335366 | 12/1998 |
| JP | 11-111913 | 4/1999 |
| JP | 2000-223657 | 8/2000 |
| JP | 2000252403 | 9/2000 |

OTHER PUBLICATIONS

Japanese Office Action, dated Sep. 26, 2006, with English-language translation.

* cited by examiner

SEMICONDUCTOR INTEGRATED CIRCUIT DEVICE

This application is a continuation of application Ser. No. 10/160,189, filed Jun. 4, 2002 now abandoned.

BACKGROUND OF THE INVENTION

1. Field of the Invention

The present invention relates to a semiconductor integrated circuit device of an SIP (System In a Package) using semiconductor integrated circuit chips with I/F (Interface) functions added thereto.

2. Description of the Prior Art

FIG. 18 is a plan view showing a semiconductor integrated circuit device (related art example 1) of a conventional SIP (System In a Package). In the drawing, reference numeral 10 indicates a bonding pad (bonding PAD), reference numeral 20 indicates a semiconductor integrated circuit chip A (Chip A) disposed on the bonding PAD 10, and reference numeral 35 indicates a semiconductor integrated circuit chip B (Chip B) excluding I/F functions, which is disposed on the bonding PAD 10, respectively. Reference numerals 40a–40e and 43a–43e respectively indicate pads (PADs) of the Chip A20, and reference numerals 41a–41e and 42a–42d respectively indicate pads (PADs) of the Chip B35. Reference numerals 50a–50f and 51a–51i respectively indicate connecting leads (LEADs) disposed around the bonding PAD 10. Reference numerals 60b, 60d and 60e respectively indicate bonding wires for connecting the Chip A20 and the Chip b35 or LEADs 50a–50f. Reference numerals 62a, 62b, 62d and 62f respectively indicate bonding wires for connecting the Chip A20 and the LEADs 51a–51i. Reference numerals 61a–61d respectively indicate bonding wires for connecting the Chip B35 and the LEADs 50a–50f.

The operation of the semiconductor integrated circuit device will next be described.

The bonding wires 62b and 62d respectively connect the PADs 43a and 43b of the Chip A20 to the LEADs 51b and 51d. The bonding wires 61a, 61b, 61c and 61d respectively connect the PADs 42a, 42b, 42c and 42d of the Chip B35 to the LEADs 50a, 50c, 50d and 50e. The bonding wire 60d connects the PAD 40d of the Chip A20 to the PAD 41d of the Chip B35. Since these bonding wires 62b, 62d, 61a, 61b, 61c, 61d and 60d are those for connecting between the adjacent PADs and LEADs or between the adjacent PADs, they are not wired so as to straddle the Chip A20 or the Chip B35.

On the other hand, the bonding wires 60b and 60e respectively connect the PADs 40b and 40e of the Chip A20 to the LEADs 50b and 50f, and the bonding wires 62a and 62f respectively connect the PADs 40a and 40c of the Chip A20 to the LEADs 51a and 51f. Since these bonding wires 60b, 60e, 62a and 62f are those for connecting between non-adjacent PADs and LEADs, they are wired so as to extend across the Chip A20 or Chip B35.

FIG. 19 is a plan view showing a semiconductor integrated circuit device (related art example 2) of a conventional SIP (System In a Package). In the drawing, reference numeral 16 indicates a bonding PAD, reference numeral 253 indicates a Chip A disposed on the bonding PAD16, and reference numeral 254 indicates a Chip B disposed on the bonding PAD 16, respectively. Reference numerals 311a–311h and 311p indicate PADs of the Chip A253, and reference numerals 312i and 312j indicate PADs of the Chip B254, respectively. Reference numerals 321a, 321c, 321e, 321g, 321i and 321j respectively indicate signal LEADs disposed around the bonding PAD 16, and reference numerals 322b, 322d, 322f, 322h and 322p respectively indicate power LEADs. Reference numerals 361a and 361b indicate bonding PAD fixing LEADs respectively. Reference numerals 352a–352h, 353i and 353j indicate bonding wires respectively.

The operation of the semiconductor integrated circuit device will next be explained.

The signal LEADs321a, 321c, 321e, 321g, 321i and 321j are respectively connected to the PADs 311a, 311c, 311e and 311g of the Chip A253 and the PADs312i and 312j of the Chip B254 by the bonding wires 352a, 352c, 352e, 352g, 353i and 353j. The power LEADs 322b, 322d, 322f, 322h and 322p are respectively connected to the PADs 311b, 311d, 311f, 311h and 311p of the Chip A253 by the bonding wires 352b, 352d, 352f, 352h and 352p. The bonding PAD 16 is fixed by the bonding PAD fixing LEADs301a and 361b.

Since the PADs 311b, 311d, 311f, 311h and 311p are connected to their corresponding power LEADs 322b, 322d, 322f, 322h and 322p and supplied with power, the power LEADs identical in number to the PADs supplied with the power are provided.

There arises a drawback in that-since the conventional semiconductor integrated circuit device is constructed as described above, a further reduction in chip size where a plurality of chips are mounted, will cause a difficulty in connecting bonding wires between PADs of a chip and LEADs at positions where the PADs of the chip and the LEADs do not adjoin, when the number of the bonding wires is identical or increases, thereby interfering with the reduction in chip size.

There also arises a drawback in that a further reduction in chip size where a plurality of chips are mounted, will cause a difficulty in supplying stable power at positions where PADs of a chip and LEADs do not adjoin, when the number of bonding wires is identical or increases, thereby interfering with the reduction in chip size.

Further, there arises a drawback in that since a plurality of chips are disposed adjacent to one another, the influence of temperatures on the respective chips by heat generation of the chips cannot be avoided, and when a chip size is further reduced, the condition of a chip-in temperature distribution must be confirmed from the need for taking into consideration the above influence of temperatures on the respective chips.

SUMMARY OF THE INVENTION

This invention has been made to solve the foregoing drawbacks. It is therefor an object of the present invention to obtain a semiconductor integrated circuit device capable of easily and reliably connecting bonding wires between PADs and LEADs.

It is another object of the present invention to obtain a semiconductor integrated circuit device that ensures the supply of stable power.

It is still another of the present invention to obtain a semiconductor integrated circuit device capable of confirming the condition of a chip-in temperature distribution.

According to a first aspect of the present invention, there is provided a semiconductor integrated circuit device including at least two semiconductor integrated circuit chips respectively provided with a plurality of PADs, a plurality of LEADs disposed around arrays of the semiconductor integrated circuit chips, and a plurality of bonding wires, wherein the plurality of bonding wires are connected so as not to straddle one semiconductor integrated circuit chip and allow wiring between the PADs of the other integrated circuit chip and the LEADs.

Thus, wiring for long bonding wires extending across the one semiconductor integrated circuit chip can be eliminated, and electrical connections of the bonding wires between the PADs and LEADs are made easily and reliably.

According to a second aspect of the present invention, there is provided a semiconductor integrated circuit device including a semiconductor integrated circuit chip provided with a plurality of PADs, a plurality of LEADs disposed around the semiconductor integrated circuit chip, and two bonding wires for connecting one LEAD of the plurality of LEADs to the two PADs of the plurality of PADs.

Thus, since wiring is made between one LEAD and two PADs, the number of LEADs to be used can be reduced.

According to a third aspect of the present invention, there is provided a semiconductor integrated circuit device including a semiconductor integrated circuit chip provided with a plurality of PADs, a plurality of LEADs disposed around the semiconductor integrated circuit chip, and a bonding wire for connecting between power supplies lying within the semiconductor integrated circuit chip.

Thus, power enhancement can be made between the power supplies, and the area of a power supply wiring region can be reduced to diminish the area of the semiconductor integrated circuit chip.

According to a fourth aspect of the present invention, there is provided a semiconductor integrated circuit device including a semiconductor integrated circuit chip provided with a plurality of PADs, one or a plurality of LEADs disposed around an array of the semiconductor integrated circuit chip, and a plurality of bonding wires. At least one LEAD of the plurality of LEADs is connected to two or more PADs of the plurality of PADs by the corresponding bonding wires of the plurality of bonding wires.

Thus, the plurality of PADs lying within a semiconductor integrated circuit chip can be supplied with power.

According to a fifth aspect of the present invention, there is provided a semiconductor integrated circuit device including a semiconductor integrated circuit chip provided with a plurality of PADs, and a plurality of temperature sensors for measuring a temperature distribution within the semiconductor integrated circuit chip.

Thus, a temperature distribution lying within the semiconductor integrated circuit chip is recognized and estimated, thereby reducing the size of the semiconductor integrated circuit chip.

DETAILED DESCRIPTION OF THE PREFERRED EMBODIMENTS

An embodiment of the present invention will be described below.

First Embodiment

Figure 1:
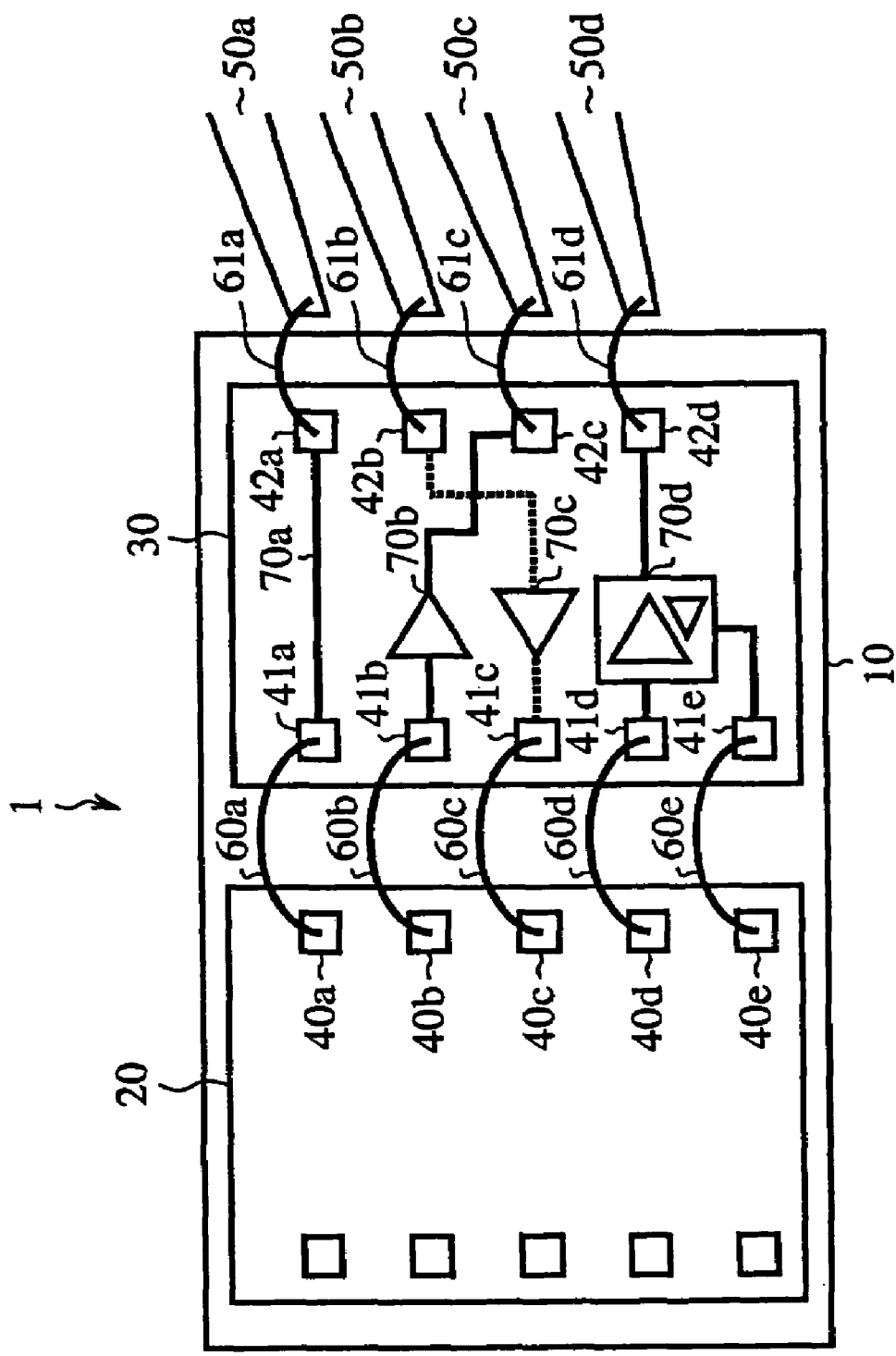
FIG. 1 is a plan view showing a semiconductor integrated circuit device according to a first embodiment of the present invention.

FIG. 1 is a plan view showing a semiconductor integrated circuit device according to a first embodiment of the present invention. In FIG. 1, reference numeral 1 indicates a semiconductor integrated circuit device. Reference numeral 10 indicates a bonding pad (bonding PAD), reference numeral 20 indicates a semiconductor integrated circuit chip A (Chip. A) disposed on the bonding PAD 10, and reference numeral 30 indicates a semiconductor integrated circuit chip B (Chip B) including interface functions (I/F functions), which is disposed on the bonding PAD 10, respectively. Reference numerals 40a–40e indicate pads (PADs) of the Chip A20, and reference numerals 41a–41e and 42a–42d indicate pads (PADs) of the Chip B30, respectively. Reference numerals 50a–50d indicate leads (LEADs) disposed around arrays of the Chip A20 and Chip B30 disposed on the bonding PAD 10. Reference numerals 60a–60e and 61a–61d respectively indicate bonding wires. Reference numeral 70a indicates a wiring element which carries out the I/F function of the Chip B30, reference numeral 70b indicates a driver element which performs the I/F function of the Chip B30, reference numeral 70c indicates a receiver element which performs the I/F function of the Chip B30, and reference numeral 70d indicates a bidirectional buffer element which carries out the I/F function of the Chip B30, respectively.

Electrical connections will next be described.

The PADs 40a, 40b, 40c, 40d and 40e of the Chip A20 are respectively connected to the PADs 41a, 41b, 41c, 41d and 41e of the Chip B30 by the bonding wires 60a, 60b, 60c, 60d and 60e. The PADs 42a, 42b, 42c and 42d of the Chip B30 are respectively connected to the LEAds50a, 50b, 50c and 50d by the bonding wires 61a, 61b, 61c and 61d.

The wiring element 70a, which carries out the I/F function, is connected between the PAD 41a and PAD 42a of the Chip B30. The driver element 70b, which performs the I/F function, is connected between the PAD 41b and PAD 42c of the Chip B30. The receiver element 70c, which performs the I/F function, is connected between the PAD 41c and PAD 42b of the Chip B30. The bidirectional buffer element 70d, which carries out the I/F function, is connected between the PAD 41d and PAD 41e of the Chip B30 and the PAD 42d thereof.

In the semiconductor integrated circuit device 1 according to the first embodiment, the Chip B30 including the I/F functions, is disposed between the Chip A20 and the LEADs 50a through 50d to wire between the Chip A20 and the LEADs 50a–50d. When the PAD 40a of the Chip A20 and the LEAD 50a are connected to each other, they are connected via the wiring element 70a of the Chip B30. When the PAD 40b of the Chip A20 and the LEAD 50c are connected to each other, they are connected via the driver element 70b of the Chip B30. When the PAD 40c of the Chip A20 and the LEAD 50b are connected to each other, they are connected via the receiver element 70c of the Chip B30. When the PAD 40d and PAD 40e of the Chip A20 and the LEAD50d are connected to one another, they are connected via the bidirectional buffer element 70d of the Chip B30.

While the driver element 70b and receiver element 70c of the Chip B30 are provided so as to intersect within the Chip B30 in FIG. 1, other wiring element 70a and the bidirectional buffer element 70d may be provided so as to intersect other elements respectively. While the wiring element 70a, the driver element 70b, the receiver element 70c and the bidirectional buffer element 70d are provided as the I/F functions one by one in FIG. 1, each of the I/F functions may comprise at least one type of element selected from a set comprising these four types of elements.

The operation of the semiconductor integrated circuit device will next be explained.

Since the PAD 40a of the Chip A20 is connected to the LEAD50a through the wiring element 70a of the Chip B30, the transfer of a signal between the PAD 40a and the LEAD50a (when the LEAD50a is of a signal LEAD) or the supply of power therebetween (when the LEAD50a is of a power LEAD) is performed.

Since the PAD 40b of the Chip A20 is connected to the LEAD 50c via the driver element 70b of the Chip B30, a signal outputted from the PAD 40b is outputted to the LEAD 50c through the driver element 70b.

Since the PAD 40c of the Chip A20 is connected to the LEAD50b via the receiver element 70c of the Chip B30, a signal inputted to the LEAD50b is inputted to the PAD 40c through the receiver element 70c.

Since the PAD 40d and PAD 40e of the Chip A20 are connected to the LEAD50d through the bidirectional buffer element 70d of the Chip B30, a signal outputted from the PAD 40d is outputted to the LEAD50d through the bidirectional buffer element 70d, whereas a signal inputted to the LEAD50d is inputted to the PAD 40e via the bidirectional buffer element 70d.

As described above, the semiconductor integrated circuit device 1 according to the first embodiment includes at least two semiconductor integrated circuit chips (Chip A20 and Chip B30) respectively provided with a plurality of PADs (PADs 40a–40e, 41a–41e and 42a–42d), a plurality of LEADs (LEADs 50a–50d) disposed around the arrays of the semiconductor integrated circuit chips, and a plurality of bonding wires (bonding wires 60a–60e and 61a–61d). The plurality of bonding wires are connected so as not to straddle one semiconductor integrated circuit chip (Chip B30) and allow wiring between the PADs (PADs 40a–40e) of the other semiconductor integrated circuit chip (Chip A20) and the LEADs (LEADs50–50d).

Further, the semiconductor integrated circuit device 1 according to the first embodiment is configured such that one semiconductor integrated circuit chip (Chip B30) has the I/F functions between the other semiconductor integrated circuit chip (Chip A20) and the LEADs (LEADs 50a–50d).

Furthermore, the semiconductor integrated circuit device 1 according to the first embodiment is configured in such a manner that each of the I/F functions includes at least one element selected from the set of the wiring element (70a), driver element (70b), receiver element (70c) and bidirectional buffer element (70d).

According to the first embodiment as described above, an advantageous effect is obtained in that since the Chip A20 and the LEADs 50a–50d are connected to one another through the Chip B30 including the I/F functions, the electrical wiring of long bonding wires that straddle the Chip B30, can be eliminated, and the wires lying between the Chip A20 and the LEADs 50a–50d can also be crossed each other. Further, an advantageous effect is obtained in that the Chip A20 and the LEADs 50a–50d can be connected to one another via the driver element 70b, receiver element 70c and bidirectional buffer element 70d.

Second Embodiment

Figure 2:
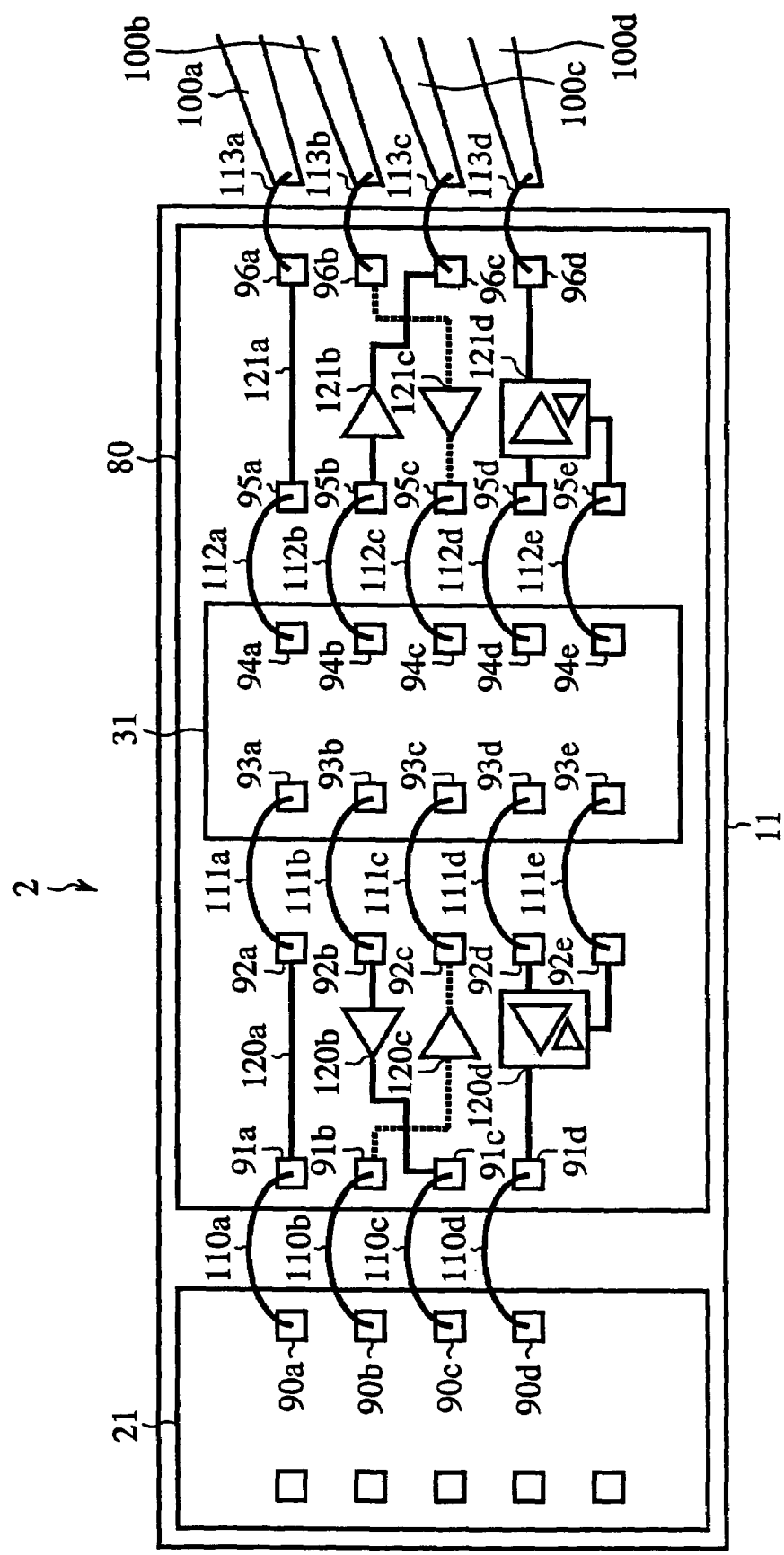
FIG. 2 is a plan view illustrating a semiconductor integrated circuit device according to a second embodiment of the present invention.

FIG. 2 is a plan view showing a semiconductor integrated circuit device according to a second embodiment of the present invention. In FIG. 2, reference numeral 2 indicates a semiconductor integrated circuit device. Reference numeral 11 indicates a bonding pad (bonding PAD), reference numeral 21 indicates a semiconductor integrated circuit chip A (Chip A) disposed on the bonding PAD 11, reference numeral 80 indicates a semiconductor integrated circuit chip (I/F Chip) including interface functions (I/F functions), which is disposed on the bonding PAD 11, and reference numeral 31 indicates a semiconductor integrated circuit chip (Chip B) disposed between portions where the I/F functions of the I/F chip80 are provided, respectively. Reference numerals 90a–90d indicate pads (PADs) of the Chip A21, reference numerals 91a–91d, 92a–92e, 95a–95e and 96a–96dindicate pads (PADs) of the I/F Chip80, and reference numerals 93a–93e and 94a–94e indicate pads (PADs) of the Chip B31, respectively. Reference numerals 100a–100d respectively indicate leads (LEADs) disposed around arrays of the Chip A21 and I/F Chip 80 disposed on the bonding PAD 11. Reference numerals 100a–110d, 111a–111e, 112a–112e, and 113a–113d indicate bonding wires respectively. Reference numerals 120a and 121a respectively indicate wiring elements which carry out I/F functions of the I/F Chip80. Reference numerals 120b and 121b respectively indicate driver elements which carry out I/F functions of the I/F Chip80. Reference numerals 120c and 121c respectively indicate receiver elements which carry out I/F functions of the I/F Chip80. Reference numerals 120d and 121d respectively indicate bidirectional buffer elements which carry out I/F functions of the I/F Chip80.

Electrical connections will next be explained.

The PADs 90a, 90b, 90c and 90d of the Chip A21 are respectively connected to the PADs 91a, 91b, 91c and 91d of the I/F Chip80 by the bonding wires 100a, 110b, 110c and 110d. The PADs 92a, 92b, 92c, 92d and 92e of the I/F Chip80 are respectively connected to the PADs 93a, 93b, 93c, 93d and 93e of the Chip B31 by the bonding wires 111a, 111b, 111c, 111d and 111e. The PADs 94a, 94b, 94c, 94d and 94e of the Chip B31 are respectively connected to the PADs 95a, 95b, 95c, 95d and 95e of the I/F Chip80 by the bonding wires 112a, 112b, 112c, 112d and 112e. The PADs 96a, 96b, 96c and 96d of the I/F Chip80 are respectively connected to the LEADs 100a, 100b, 100c and 100d by the bonding wires 113a, 113b, 113c and 113d.

The wiring elements 120a and 121a, which carry out the I/F functions, are respectively connected between the PAD 91a and PAD 92a of the I/F Chip 80 and between the PAD 95a and PAD 96a thereof. The receiver element 120c and the driver element 121b, which carry out the I/F functions, are respectively connected between the PAD 91b and PAD 92c of the I/F Chip 80 and between the PAD 95b and PAD 96c thereof. The driver element 120b and the receiver element 121c, which carry out the I/F functions, are respectively connected between the PAD 91c and PAD 92b of the I/F Chip 80 and between the PAD 95c and PAD 96b thereof. The bidirectional buffer element 120d and the bidirectional buffer element 121d, which carry out the I/F functions, are respectively connected between the PAD 91d of the I/F Chip 80 and the PAD 92d and PAD 92e thereof, and between the PAD 95d and PAD 95e of the I/F chip 80 and the PAD 96d thereof.

In the semiconductor integrated circuit device 2 according to the second embodiment, the I/F Chip 80 is disposed between the Chip A21 and the LEADs 100a–100d, and the Chip B31 is placed on between portions where the I/F functions of the I/F Chip 80 are provided, in order to wire between the Chip A21 and the Chip B31 and between the Chip B31 and the LEADs 100a–100d. When the PAD 90a of the Chip A21 and the PAD 93a of the Chip B31 are connected to each other, they are connected via the wiring element 120a of the I/F Chip 80. When the PAD 94a of the Chip B31 and the LEAD 100a are connected to each other, they are connected via the wiring element 121a of the I/F Chip 80. When the PAD 90b of the Chip A21 and the PAD 93c of the Chip B31 are connected to each other, they are connected via the receiver element 120c of the I/F Chip 80. When the PAD 94b of the Chip B31 and the LEAD 100c are connected to each other, they are connected via the driver element 121b of the I/F Chip 80. When the PAD 90c the Chip A21 and the PAD 93b of the Chip B31 are connected to each other, they are connected via the driver element 120b of the I/F Chip 80. When the PAD 94c of the Chip B31 and the LEAD 100b are connected to each other, they are connected via the receiver element 121c of the I/F Chip 80. When the PAD 90d of the Chip A21 and the PAD 93d and PAD 93e of the Chip B31 are connected to one another, they are connected via the bidirectional buffer element 120d of the I/F Chip80. When the PAD 94d and PAD 94e of the Chip B31 and the LEAD 100d are connected to one another, they are connected via the bidirectional buffer element 121d of the I/F Chip 80.

While the driver element 120b and receiver element 120c of the I/F Chip 80, and the driver element 121b and receiver element 121c thereof are respectively provided so as to intersect one another within the I/F Chip 80 in FIG. 2, other wiring elements 120a and 121a and bidirectional buffer elements 120d and 121d may be provided so as to intersect other elements respectively. Further, while the wiring elements 120a and 112a, the driver elements 120b and 121b, the receiver elements 120c and 121c and the bidirectional buffer elements 120d and 121d are respectively provided as the I/F functions in FIG. 2, each of the I/F functions may comprise at least one type of element selected from a set comprising these four types of elements.

The operation of the semiconductor integrated circuit device will next be described.

Since the PAD 94a of the Chip B31 is connected to its corresponding LEAD 100a via the wiring element 121a of the I/F Chip 80, the transfer of a signal between the PAD 94a and the LEAD 100a (when the LEAD 100a is of a signal LEAD) or the supply of power therebetween (when the LEAD 100a is of a power LEAD) is performed.

Since the PAD 94b of the Chip B31 is connected to its corresponding LEAD 100c via the driver element 121b of the I/F Chip 80, a signal outputted from the PAD 94b is outputted to the LEAD100c through the driver element 121b.

Since the PAD 94c of the Chip B31 is connected to its corresponding LEAD 100b via the receiver element 121c of the I/F chip80, a signal inputted to the LEAD 100b is inputted to the PAD 94c through the receiver element 121c.

Since the PAD 94d and PAD 94e of the Chip B31 are connected to their corresponding LEAD 100d via the bidirectional buffer element 121d of the I/F Chip 80, a signal outputted from the PAD 94d is outputted to the LEAD 100d through the bidirectional buffer element 121d, whereas a signal inputted to the LEAD 100d is inputted to the PAD 94e through the bidirectional buffer element 121d.

Since the PAD 93a of the Chip B31 is connected to its corresponding PAD 90a of the Chip A21 via the wiring element 120a of the I/F Chip 80, the transfer of a signal between the PAD 93a and the PAD 90a (when the PAD 93a is of a signal PAD) or the supply of power therebetween (when the PAD 93a is of a power PAD) is performed.

Since the PAD 93b of the Chip B31 is connected to its corresponding PAD 90c of the Chip A21 via the driver element 120b of the I/F Chip80, a signal outputted from the PAD 93b is supplied to the PAD 90c through the driver element 120b.

Since the PAD 93c of the Chip B31 is connected to its corresponding PAD 90b of the Chip A21 via the receiver element 120c of the I/F Chip 80, a signal outputted from the PAD 90b is supplied to the PAD 93c through the receiver element 120c.

Since the PAD 93d and PAD 93e of the Chip B31 are connected to their corresponding PAD 90d of the Chip A21 via the bidirectional buffer element 120d of the I/F Chip 80, a signal outputted from the PAD 93d is supplied to the PAD 90d through the bidirectional buffer element 120d, whereas a signal outputted from the PAD 90d is supplied to the PAD 93e through the bidirectional buffer element 120d.

As described above, the semiconductor integrated circuit device 2 according to the second embodiment includes two semiconductor integrated circuit chips (Chip A21 and Chip B31) respectively provided with a plurality of PADs (PADs 90a–90d, PADs 93a–93e and PADs 94a–94e), a plurality of LEADs (LEADs 100a–100d) disposed around the arrays of the semiconductor integrated circuit chips, and a plurality of bonding wires (bonding wires 111a–111e, 112a–112e and 113a–113d). The plurality of bonding wires are connected so as not to straddle one semiconductor integrated circuit chip (Chip B31) and allow wiring between the PADs (PADs 90a–90d) of the other semiconductor integrated circuit chip (Chip A21) and the LEADs (LEADs 100a–100d).

Further, the semiconductor integrated circuit device 2 according to the second embodiment has also a third semiconductor integrated circuit chip (I/F Chip 80) provided with a plurality of PADs (PADs 91a–91d, 92a–92e, 95a–95e and 96a–96d). The third semiconductor integrated circuit chip (I/F Chip 80) has the I/F functions between the other semiconductor integrated circuit chip (Chip A21) and the one semiconductor integrated circuit chip (Chip B31) and the I/F functions between the one semiconductor integrated circuit chip (Chip B31) and the LEADs (LEADs 100a–100d).

Furthermore, the semiconductor integrated circuit device 2 according to the second embodiment is configured in such a manner that each of the I/F functions includes at least one element selected from the set of the wiring elements (120a and 121a), driver elements (120b and 121b), receiver elements (120c and 121c) and bidirectional buffer elements (120d and 121d)

According to the second embodiment as described above, an advantageous effect is obtained in that since the Chip A21 and the Chip B31, and the Chip B31 and the LEADs 100a–100d are respectively connected to one another through the I/F Chip 80 including the I/F functions, the electrical wiring of long bonding wires that straddle the Chip B31, can be eliminated when the Chip A21 and the LEADs 100a–100d are connected, and the wires lying between the Chip A21 and the LEADs 100a–100d can also be crossed each other. An advantageous effect is also obtained in that the Chip A21 and the LEADs 100a–100d can be connected to one another via the driver elements 120b and 121b, receiver elements 120c and 121c and bidirectional buffer elements 120d and 121d. Further, when the Chip B31 and the Chip A21 are connected to each other, and the Chip B31 and the LEADs 100a–100d are connected, the electrical wiring of long bonding wires that extend across the I/F Chip 80, can be eliminated, and the wires lying between the Chip B31 and the Chip A21 and between the Chip B31 and the LEADs 100a–100d can also be crossed one another. Furthermore, an advantageous effect is obtained in that the Chip B31 and the Chip A21, and the Chip B31 and the LEADs 100a–100d can respectively be connected to one another via the driver elements 120b and 121b, receiver elements 120c and 121c and bidirectional buffer elements 120d and 121d.

Third Embodiment

Figure 3:
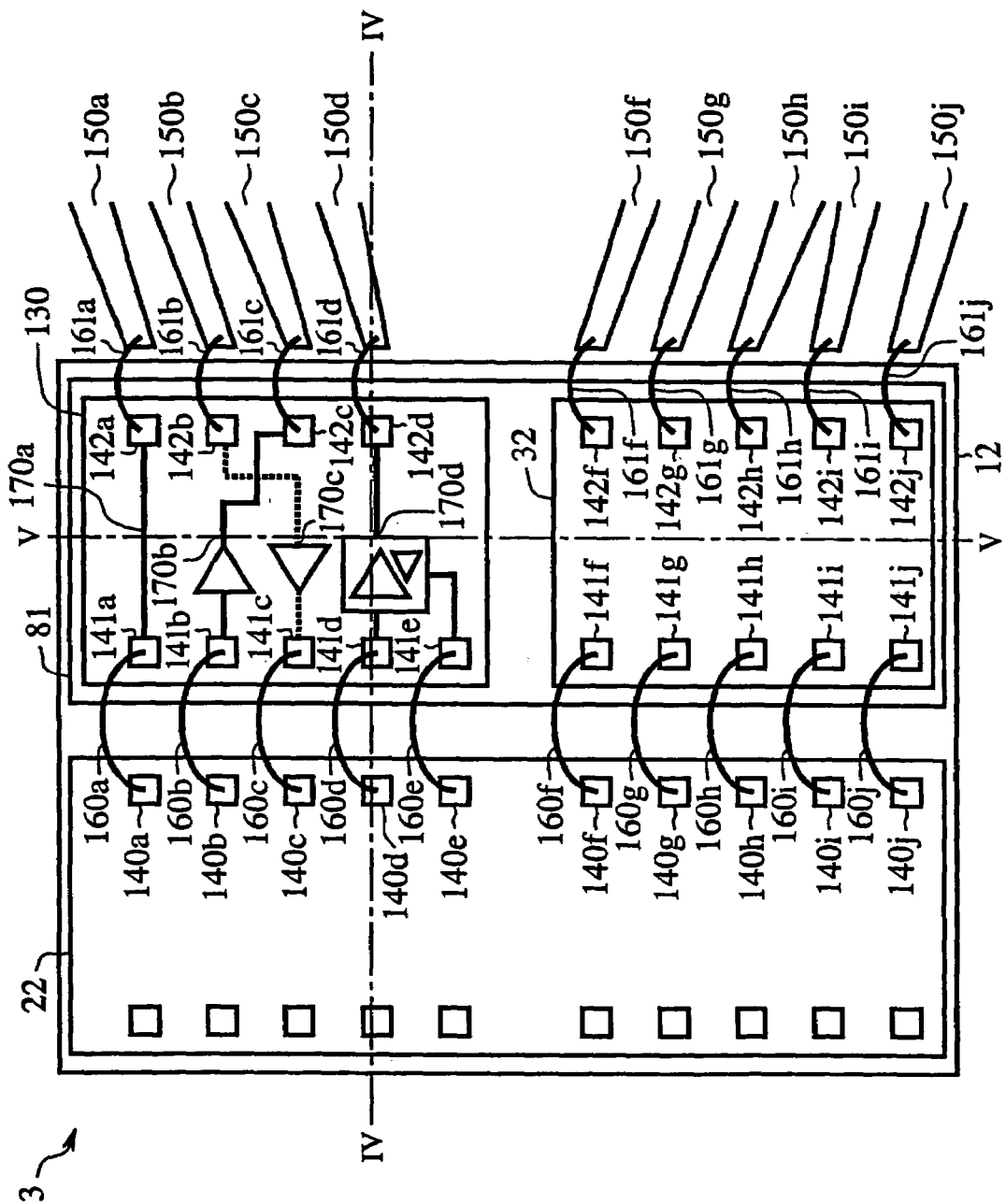
FIG. 3 is a plan view depicting a semiconductor integrated circuit device according to a third embodiment of the present invention.
Figure 4:
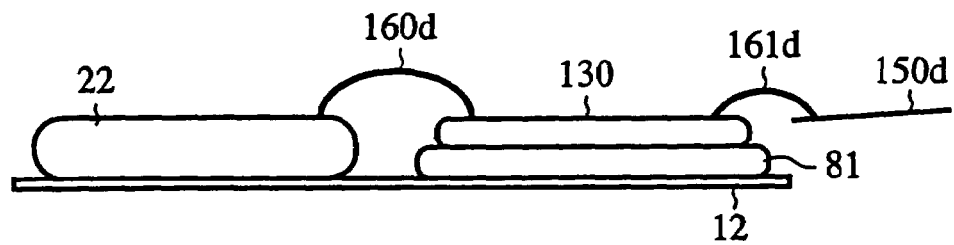
FIG. 4 is a cross-sectional view taken along line IV—IV of FIG. 3.
Figure 5:
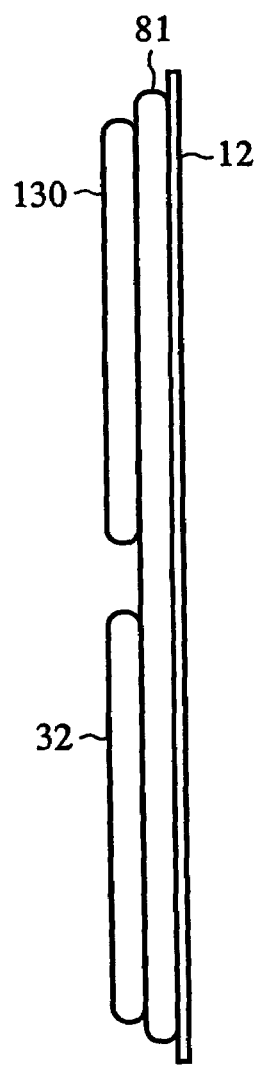
FIG. 5 is a cross-sectional view taken along line V—V of FIG. 3.

FIG. 3 is a plan view showing a semiconductor integrated circuit device according to a third embodiment of the present invention. FIG. 4 is a cross-sectional view taken along line IV—IV of FIG. 3, and FIG. 5 is a cross-sectional view taken along line V—V of FIG. 3, respectively. In FIG. 4, reference numeral 3 indicates a semiconductor integrated circuit device. Reference numeral 12 indicates a bonding pad (bonding PAD), reference numeral 22 indicates a semiconductor integrated circuit chip A (Chip A) disposed on the bonding PAD 12, reference numeral 81 indicates an I/F semiconductor integrated circuit chip (I/F Chip) including interface functions (I/F functions), which is disposed on the bonding PAD 12, reference numeral 32 indicates a semiconductor integrated circuit chip B (Chip B) disposed on the I/F chip 81, and reference numeral 130 indicates a height adjusting semiconductor integrated circuit chip (height adjustment Chip) including interface functions (I/F functions), which is disposed on the I/F chip 81, respectively. Reference numerals 140a–140j indicate pads (PADs) of the Chip A22, reference numerals 141a–141e and 142a–142d indicate pads (PADs) of the height adjustment Chip130, and reference numerals 141f–141j and 142f–142j indicate pads (PADs) of the Chip B32, respectively. Reference numerals 150a–150d and 150f–150j respectively indicate leads (LEADs) disposed around arrays of the Chip A22 and I/F Chip81 disposed on the bonding PAD12. Reference numerals 160a–160j, 161a–161d, and 161f–161j indicate bonding wires respectively. Reference numeral 170a indicates a wiring element which carries out an I/F function of the height adjusting Chip130. Reference numeral 170b indicates a driver element which carries out an I/F function of the height adjusting Chip130. Reference numeral 170c indicates a receiver element which carries out an I/F function of the height adjusting Chip130. Reference numeral 170d indicates a bidirectional buffer element which carries out an I/F function of the height adjusting Chip130.

Electrical connections will next be explained.

The PADs 140a, 140b, 140c, 140d and 140e of the Chip A22 are respectively connected to the PADs 141a, 141b, 141c, 141d and 141e of the height adjusting Chip130 by the bonding wires 160a, 160b, 160c, 160d and 160e. The PADs 142a, 142b, 142c and 142d of the height adjusting Chip130 are respectively connected to the LEADs 150a, 150b, 150c and 150d by the bonding wires 161a, 161b, 161c and 161d. The PADs 141a–141e and 142a–142d of the height adjusting Chip130 are respectively disposed at such heights as to be provided flush with the PADs 140a–140e of the Chip A22. The PADs 140f, 140g, 140h, 140i and 140j of the Chip A22 are respectively connected to the PADs 141f, 141g, 141h, 141i and 141j of the Chip B32 by the bonding wires 160f, 160g, 160h, 160i and 160j. The PADs 142f, 142g, 142h, 142i and 142j of the Chip B32 are respectively connected to the LEADs 150f, 150g, 150h, 150i and 150j by the bonding wires 161f, 161g, 161h, 161i and 161j.

The wiring element 170a, which carries out the I/F function, is connected between the PAD 141a and PAD 142a of the height adjusting Chip 130. The driver element 170b, which effects the I/F function, is connected between the PAD 141b and PAD 142c of the height adjusting Chip 130. The receiver element 170c, which carries out the I/F function, is connected between the PAD 141c and PAD 142b of the height adjusting Chip 30. The bidirectional buffer element 170d, which carries out the I/F function, is connected between the PAD 141d and PAD 141e of the height adjusting Chip 130 and the PAD 142d thereof.

In the semiconductor integrated circuit device 3 according to the third embodiment, the height adjusting I/F Chip 130 is disposed on the I/F Chip 81 placed between the Chip A22 and the LEADs 150a–150d in order to wire between the Chip A22 and the LEADs 150a–150d. Further, the Chip B32 is placed at a portion where the height adjusting I/F Chip 130 of the I/F Chip 81 is not disposed. When the PAD 140a of the Chip A22 and the LEAD 150a are connected to each other, they are connected via the wiring element 170a of the height adjusting I/F Chip 130. When the PAD 140b of the Chip A22 and the LEAD 150c are connected to each other, they are connected via the driver element 170b of the height adjusting I/F Chip 130. When the PAD 140c of the Chip A22 and the LEAD 150b are connected to each other, they are connected via the receiver element 170c of the height adjusting I/F Chip130. When the PAD 140d and PAD 140e of the Chip A22 and the LEAD 150d are connected to one another, they are connected via the bidirectional buffer element 170*d* of the height adjusting I/F Chip 130.

While the driver element 170*b* and receiver element 170*c* of the height adjusting I/F Chip 130 are provided so as to intersect each other within the height adjusting I/F Chip 130 in FIG. 3, other wiring element 170*a* and bidirectional buffer element 170*d* may be provided so as to intersect other elements respectively. Further, while the wiring element 170*a*, driver element 170*b*, receiver element 170*c* and bidirectional buffer element 170*d* are provided one by one as the I/F functions in FIG. 3, each of the I/F functions may comprise at least one type of element selected from a set comprising these four types of elements.

The operation of the semiconductor integrated circuit device will next be described.

Since the PAD 140*a* of the Chip A22 is connected to its corresponding LEAD 150*a* via the wiring element 170*a* of the height adjusting I/F Chip 130, the transfer of a signal between the PAD 140*a* and the LEAD 150*a* (when the LEAD 150*a* is of a signal LEAD) or the supply of power therebetween (when the LEAD 150*a* is of a power LEAD) is performed.

Since the PAD 140*b* of the Chip A22 is connected to its corresponding LEAD 150*c* via the driver element 170*b* of the height adjusting I/F Chip 130, a signal outputted from the PAD 140*b* is outputted to the LEAD 150*c* through the driver element 170*b*.

Since the PAD 140*c* of the Chip A22 is connected to its corresponding LEAD150*b* via the receiver element 170*c* of the height adjusting I/F chip 130, a signal inputted to the LEAD150*b* is inputted to the PAD 140*c* through the receiver element 170*c*.

Since the PAD 140*d* and PAD 140*e* of the Chip A22 are connected to their corresponding LEAD 150*d* via the bidirectional buffer element 170*d* of the height adjusting I/F Chip 130, a signal outputted from the PAD 140*d* is outputted to the LEAD 150*d* through the bidirectional buffer element 170*d*, whereas a signal inputted to the LEAD 150*d* is inputted to the PAD 140*e* through the bidirectional buffer element 170*d*.

As described above, the semiconductor integrated circuit device 3 according to the third embodiment includes two semiconductor integrated circuit chips (Chip A22 and Chip B32) respectively provided with a plurality of PADs (PADs 140*a*–140*j*, 141*f*–141*j*, and 142*f*–142*j*), a plurality of LEADs (LEADs 150*a*–150*j*) disposed around the arrays of the semiconductor integrated circuit chips, and a plurality of bonding wires (bonding wires 160*a*–160*j*, 161*a*–161*d* and 161*f*–161*j*). The plurality of bonding wires are connected so as not to straddle or extend across one semiconductor integrated circuit chip (Chip B32) and allow wiring between the PADs (PADs 140*a*–140*j*) of the other semiconductor integrated circuit chip (Chip A22) and the LEADs (LEADs 150*a*–150*d*).

Further, the semiconductor integrated circuit device 3 according to the third embodiment has also a third semiconductor integrated circuit chip (I/F Chip 81) disposed under the one semiconductor integrated circuit chip (Chip B32), and a height adjusting semiconductor integrated circuit chip (height adjusting Chip 130) provided with a plurality of PADs (PADs 141*a*–141*e* and 142*a*–142*d*), which is disposed on the third semiconductor integrated circuit chip (I/F Chip 81) so as to adjoin the one semiconductor integrated circuit chip (Chip B32). The height adjusting semiconductor integrated circuit chip (height adjusting Chip 130) has the I/F functions between the other semiconductor integrated circuit chip (Chip A22) and the LEADs (LEADs 150*a*–150*d*). The plurality of PADs (PADs 141*a*–141*e* and 142*a*–142*d*) of the height adjusting semiconductor integrated circuit chip (height adjusting Chip130) are respectively disposed on the same plane as the plurality of PADs (PADs 140*a*–140*j*) of the other semiconductor integrated circuit chip (Chip A22).

Furthermore, the semiconductor integrated circuit device 3 according to the third embodiment is configured in such a manner that each of the I/F functions includes at least one element selected from the set of the wiring element (170*a*), driver element (170*b*), receiver element (170*c*) and bidirectional buffer element (170*d*).

According to the third embodiment as described above, an advantageous effect is obtained in that since the Chip A22 and LEADs 150*a*–150*d* are connected via the height adjusting Chip130 including the I/F functions, which is disposed on the I/F Chip 81, adjacent to the Chip B32, the electrical wiring of long bonding wires that extend across the Chip B32, can be eliminated when the Chip A22 and the LEADs 150*a*–150*d* are connected, and the wires lying between the Chip A22 and the LEADs 150*a*–150*d* can also be crossed each other. An advantageous effect is also obtained in that the Chip A22 and the LEADs 150*a*–150*d* can be connected to one another via the driver element 170*b*, receiver element 170*c* and bidirectional buffer element 170*d*. Further, an advantageous effect is obtained in that since the PADs 141*a*–141*e* and 142*a*–142*d* of the height adjusting Chip 130 are disposed flush with the PADs 140*a*–140*j* of the Chip A22, wiring can easily be carried out.

Fourth Embodiment

Figure 6:
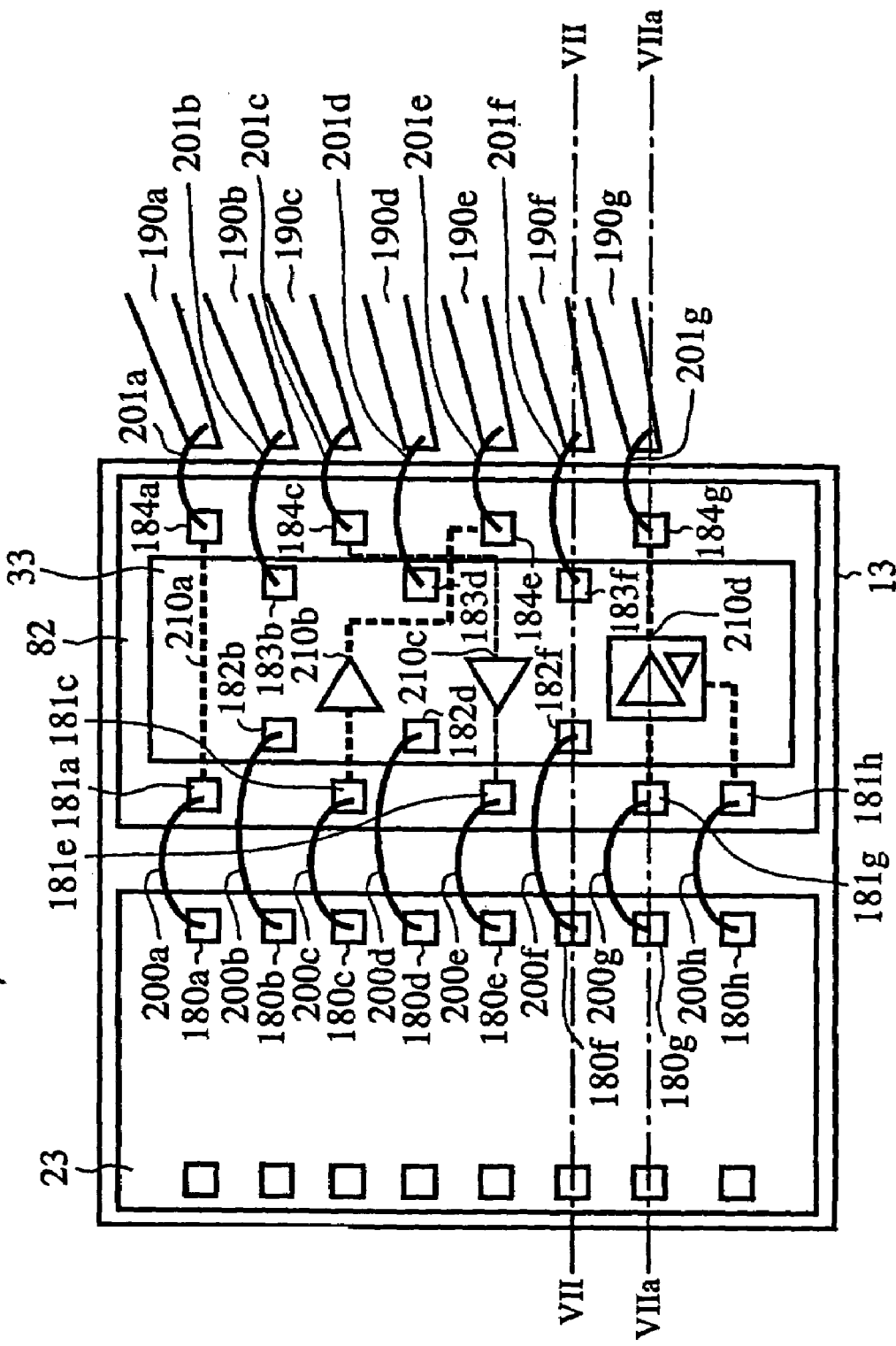
FIG. 6 is a plan view showing a semiconductor integrated circuit device according to a fourth embodiment of the present invention.
Figure 7:
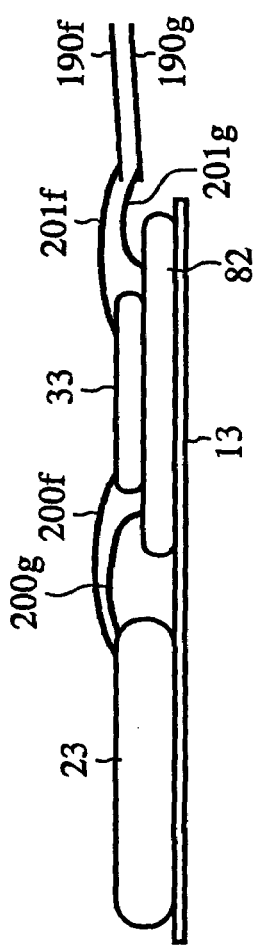
FIG. 7 is a cross-sectional view taken along line VII—VII of FIG. 6.

FIG. 6 is a plan view showing a semiconductor integrated circuit device according to a fourth embodiment of the present invention. FIG. 7 is a cross-sectional view taken along line VII—VII of FIG. 6 and also shows elements of structure or components which appear in a cross-section taken along line VIIa—VIIa of FIG. 6 to intelligibly show a structure of the semiconductor integrated circuit device. In FIG. 6, reference numeral 4 indicates a semiconductor integrated circuit device. Reference numeral 13 indicates a bonding pad (bonding PAD), reference numeral 23 indicates a semiconductor integrated circuit chip A (Chip A) disposed on the bonding PAD 13, reference numeral 82 indicates a semiconductor integrated circuit chip (I/F Chip) including interface functions (I/F functions), which is disposed on the bonding PAD 13, and reference numeral 33 indicates a semiconductor integrated circuit chip B (Chip B) disposed on the I/F Chip 82, respectively. Reference numerals 180*a*–180*h* indicate pads (PADs) of the Chip A23, reference numerals 181*a*, 181*c*, 181*e*, 181*g*, 181*h*, 184*a*, 184*c*, 184*e* and 184*g* indicate pads (PADs) of the I/F Chip 82, and reference numerals 182*b*, 182*d*, 182*f*, 183*b*, 183*d* and 183*f* indicate pads (PADs) of the Chip B33, respectively. Reference numerals 190*a*–190*g* respectively indicate leads (LEADs) disposed around arrays of the Chip A23 and I/F Chip 82 disposed on the bonding PAD 13. Reference numerals 200*a*–200*h* and 201*a*–201*g* indicate bonding wires respectively. Reference numeral 210*a* indicates a wiring element which carries out an I/F function of the I/F Chip 82. Reference numeral 210*b* indicates a driver element which carries out an I/F function of the I/F Chip 82. Reference numeral 210*c* indicates a receiver element which carries out an I/F function of the I/F Chip 82. Reference numeral 210*d* indicates a bidirectional buffer element which carries out an I/F function of the I/F Chip 82.

Electrical connections will next be explained.

The PADs 180a, 180c, 180e, 180g and 180h of the Chip A23 are respectively connected to the PADs 181a, 181c, 181e, 181g and 181h of the I/F Chip 82 by the bonding wires 200a, 200c, 200e, 200g and 200h. The PADs 180b, 180d and 180f of the Chip A23 are respectively connected to the PADs 182b, 182d and 182f of the Chip B33 by the bonding wires 200b, 200d and 200f. The PADs 184a, 184c, 184e and 184g of the I/F Chip82 are respectively connected to the LEADs 190a, 190c, 190e and 190g by the bonding wires 201a, 201c, 201e and 201g. The PADs 183b, 183d and 183f of the Chip B33 are respectively connected to the LEADs 190b, 190d and 190f by the bonding wires 201b, 201d and 201f.

The wiring element 210a, which carries out the I/F function, is connected between the PAD 181a and PAD 184a of the I/F Chip 82. The driver element 210b, which effects the I/F function, is connected between the PAD 181c and PAD 184e of the I/F Chip 82. The receiver element 210c, which carries out the I/F function, is connected between the PAD 181e and PAD 184c of the I/F Chip82. The bidirectional buffer element 210d, which carries out the I/F function, is connected between the PAD 181g and PAD 181h of the I/F Chip 82 and the PAD 184g thereof.

In the semiconductor integrated circuit device 4 according to the fourth embodiment, the I/F Chip 82 is disposed under the Chip B33 placed between the Chip A23 and the LEADs 190a–190g in order to wire between the Chip A23 and the LEADs 190a–190g. When the PAD 180a of the Chip A23 and the LEAD 190a are connected to each other, they are connected via the wiring element 210a of the I/F Chip 82. When the PAD 180c of the Chip A23 and the LEAD 190e are connected to each other, they are connected via the driver element 210b of the I/F Chip 82. When the PAD 180e of the Chip A23 and the LEAD 190c are connected to each other, they are connected via the receiver element 210c of the I/F Chip 82. When the PAD 180g and PAD 180h of the Chip A23 and the LEAD 190g are connected to one another, they are connected via the bidirectional buffer element 210d of the I/F Chip 82.

While the driver element 210b and receiver element 210c of the I/F Chip 82 are provided so as to intersect each other within the I/F Chip 82 in FIG. 6, other wiring element 210a and bidirectional buffer element 210d may be provided so as to intersect other elements respectively. Further, while the wiring element 210a, driver element 210b, receiver element 210c and bidirectional buffer element 210d are provided one by one as the I/F functions in FIG. 6, each of the I/F functions may comprise at least one type of element selected from a set comprising these four types of elements.

The operation of the semiconductor integrated circuit device will next be described.

Since the PAD 180a of the Chip A23 is connected to its corresponding LEAD 190a via the wiring element 210a of the I/F Chip 82, the transfer of a signal between the PAD 180a and the LEAD 190a (when the LEAD 190a is of a signal LEAD) or the supply of power therebetween (when the LEAD 190a is of a power LEAD) is performed.

Since the PAD 180c of the Chip A23 is connected to its corresponding LEAD 190e via the driver element 210b of the I/F Chip 82, a signal outputted from the PAD 180c is outputted to the LEAD190e through the driver element 210b.

Since the PAD 180e of the Chip A23 is connected to its corresponding LEAD 190c via the receiver element 210c of the I/F Chip82, a signal inputted to the LEAD 190c is inputted to the PAD 180e through the receiver element 210c.

Since the PAD 180g and PAD 180h of the Chip A23 are connected to their corresponding LEAD 190g via the bidirectional buffer element 210d of the I/F Chip 82, a signal outputted from the PAD 180g is outputted to the LEAD 190g through the bidirectional buffer element 210d, whereas a signal inputted to the LEAD 190g is inputted to the PAD 180h through the bidirectional buffer element 210d.

As described above, the semiconductor integrated circuit device 4 according to the fourth embodiment includes two semiconductor integrated circuit chips (Chip A23 and Chip B33) respectively provided with a plurality of PADs (PADs 180a–180h, 182b, 182d, 182f, 183b, 183d and 183f), a plurality of LEADs (LEADs 190a–190g) disposed around the arrays of the semiconductor integrated circuit chips, and a plurality of bonding wires (bonding wires 200a–200h, and 201a–201g). The plurality of bonding wires (bonding wires 200a–200h and 201a–201g) are connected so as not to straddle or extend across one semiconductor integrated circuit chip (Chip B33) and allow wiring between the PADs (PADs 180a–180h) of the other semiconductor integrated circuit chip (Chip A23) and the LEADs (LEADs 190a–190g).

Further, the semiconductor integrated circuit device 4 according to the fourth embodiment also has an I/F semiconductor integrated circuit chip (I/F Chip 82) provided with a plurality of PADs (PADs 181a, 181c, 181e, 181g, 181h, 184a, 184c, 184e and 184g), which is disposed under the one semiconductor integrated circuit chip (Chip B33). The I/F semiconductor integrated circuit chip (I/F Chip82) has the I/F functions between the other semiconductor integrated circuit chip (Chip A23) and the LEADs (LEADs 190a–190g).

Furthermore, the semiconductor integrated circuit device 4 according to the fourth embodiment is configured in such a manner that each of the I/F functions includes at least one element selected from the set of the wiring element (210a), driver element (210b), receiver element (210c) and bidirectional buffer element (210d).

According to the fourth embodiment as described above, an advantageous effect is obtained in that since the Chip A23 and the LEADs 190a–190g are connected to one another via the I/F Chip82 including the I/F functions, which is disposed under the Chip B33, the electrical wiring of long bonding wires that extend across the Chip B33, can be eliminated where the Chip A23 and the LEADs 190a–190g are connected, and the wires lying between the Chip A23 and the LEADs 190a–190g can also be crossed each other. An advantageous effect is also obtained in that the Chip A23 and the LEADs 190a–190g can be connected to one another via the driver element 210b, receiver element 210c and bidirectional buffer element 210d. Further, an advantageous effect is obtained in that since the I/F Chip82 including the I/F functions is placed under the Chip B33, the area of the whole semiconductor integrated circuit device of SIP can be reduced.

Fifth Embodiment

Figure 8:
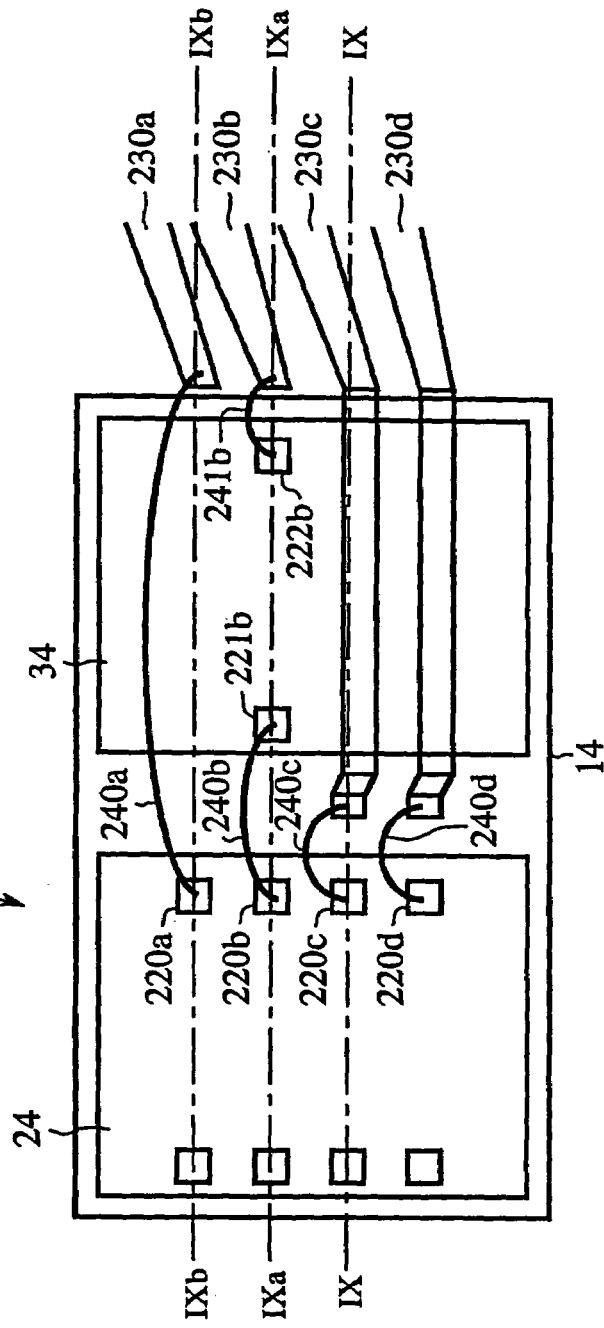
FIG. 8 is a plan view illustrating a semiconductor integrated circuit device according to a fifth embodiment of the present invention.
Figure 9:
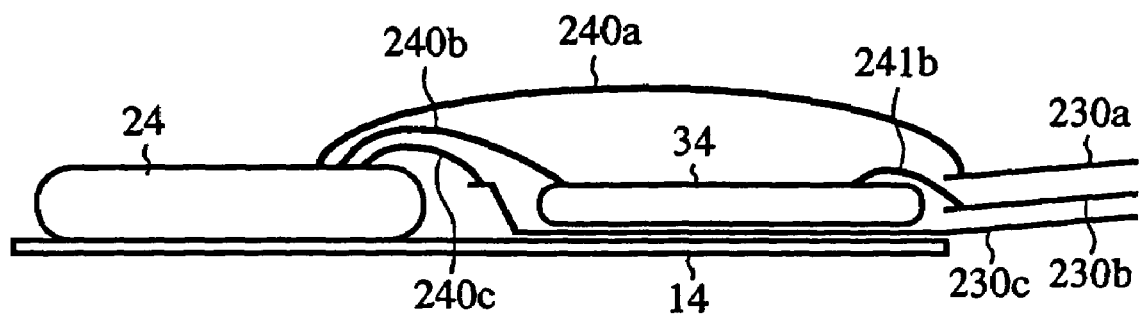
FIG. 9 is a cross-sectional view taken along IX—IX of FIG. 8.

FIG. 8 is a plan view showing a semiconductor integrated circuit device according to a fifth embodiment of the present invention. FIG. 9 is a cross-sectional view taken along line IX—IX of FIG. 8 and also shows elements of structure or components which appear in cross-sections taken along line IXa—IXa and line IXb—IXb of FIG. 8 to intelligibly indicate a structure of the semiconductor integrated circuit device. In FIG. 8, reference numeral 5 indicates a semiconductor integrated circuit device. Reference numeral 14 indicates a bonding pad (bonding PAD), reference numeral 24 indicates a semiconductor integrated circuit chip A (Chip A)

disposed on the bonding PAD 14, and reference numeral 34 indicates a semiconductor integrated circuit chip B (Chip B) disposed on the bonding PAD 14, respectively. Reference numerals 220a–220d indicate pads (PADs) of the Chip A, and reference numerals 221b and 222b indicate pads (PADs) of the Chip B34, respectively. reference numerals 230a–230d respectively indicate leads (LEADs) disposed around arrays of the Chip A24 and Chip B34 disposed on the bonding PAD 14. Reference numerals 240a–240d and 241b indicate bonding wires respectively. The LEADs 230c and 230d extend under the Chip B34 and reach their corresponding positions adjacent to the Chip A24.

Electrical connections will next be explained.

The PAD 220a of the Chip A24 is connected to the LEAD 230a by the bonding wire 240a. Since the connection therebetween by the bonding wire 240a straddles the Chip B34, this is not a structure intended for the semiconductor integrated circuit device of the invention. However, it has been shown for comparison with the characteristics of a structure of the fifth embodiment to be described later. The PAD 220b of the Chip A24 is connected to its corresponding PAD 221b of the Chip B34 by the bonding wire 240b. The PADs 220c and 220d of the Chip A24 are respectively connected to the LEADs 230c and 230d by the bonding wires 240c and 240d.

In the semiconductor integrated circuit device according to the fifth embodiment, the PADs 220c and 220d of the Chip A24 are respectively connected to the LEADs 230c and 230d by the bonding wires 240c and 240d, which LEADs extend under the Chip B34 and reach the positions adjacent to the Chip A24. Thus, since the LEADs 230c and 230d extend under the Chip B34 and reach the positions adjacent to the Chip A24, the bonding wires 240c and 240d can be wired without extending across the Chip B34 as in the case of the bonding wire 240a for connecting the PAD 220a to the LEAD 230a.

The operation of the semiconductor integrated circuit device will next be described.

Since the PAD 220b of the Chip A24 is connected to the PAD 221b of the Chip B34 by the bonding wire 240b, the transfer of a signal or the supply of power is performed between the PAD 220b and the PAD 221b. Since the PAD 220c of the Chip A24 is connected to it corresponding LEAD 230c by the bonding wire 240c, the transfer of a signal is performed between the PAD 220c and the LEAD 230c (where the LEAD 230c is of a signal LEAD) or the supply of power is performed therebetween (where the LEAD 230c is of a power LEAD). Since the PAD 220d of the Chip A24 is connected to its corresponding LEAD230d by the bonding wire 240d, the transfer of a signal is performed between the PAD 220d and the LEAD 230d (when the LEAD 230d is of a signal LEAD) or the supply of power is performed therebetween (when the LEAD 230d is of a power LEAD). Since the PAD 222b of the Chip B34 is connected to its corresponding LEAD 230b by the bonding wire 241b, the transfer of a signal is performed between the PAD 222b and the LEAD 230b (when the LEAD230b is of a signal LEAD) or the supply of power is performed therebetween (when the LEAD230b is of a power LEAD).

As described above, the semiconductor integrated circuit device 5 according to the fifth embodiment includes two semiconductor integrated circuit chips (Chip A24 and Chip B34) respectively provided with a plurality of PADs (PADs 220a–220d, 221b and 222b), a plurality of LEADs (LEADs 230a–230d) disposed around the arrays of the semiconductor integrated circuit chips, and a plurality of bonding wires (bonding wires 240b–240d, and 241b). The plurality of bonding wires (bonding wires 240b–240d and 241b) are connected so as not to straddle or extend across one semiconductor integrated circuit chip (Chip B34) and allow wiring between the PADs (PADs220b–220d) of the other semiconductor integrated circuit chip (Chip A24) and the LEADs (LEADs 230b–230d).

Further, the semiconductor integrated circuit device 5 according to the fifth embodiment includes LEADs which extend under the one semiconductor integrated circuit chip (Chip B34) and reach their corresponding positions adjacent to the other semiconductor integrated circuit chip (Chip A24).

According to the fifth embodiment as described above, an advantageous effect is obtained in that since there are provided the LEADs which extend under the Chip B34 and reach the positions adjacent to the Chip A24, wiring between the Chip A24 and the LEADs can be performed in the shortest form.

Sixth Embodiment

Figure 10:
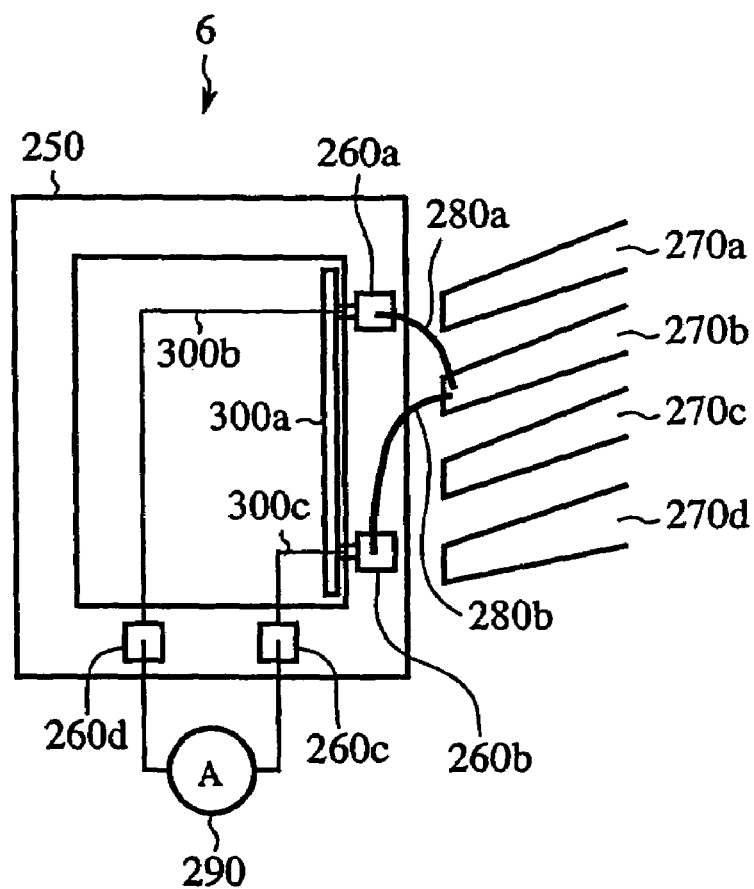
FIG. 10 is a plan view showing a semiconductor integrated circuit device according to a sixth embodiment of the present invention.

FIG. 10 is a plan view showing a semiconductor integrated circuit device according to the sixth embodiment of the present invention. In FIG. 10, reference numeral 6 indicates a semiconductor integrated circuit device, and reference numeral 250 indicates a semiconductor integrated circuit chip (Chip). Reference numerals 260a–260d indicate pads (PADs) of the Chip 250, and reference numerals 270a–270d indicate LEADs (LEAD) disposed around the Chip250. Reference numerals 280a and 280b indicate bonding wires. Reference numeral 290 indicates an ammeter with a dc power supply (not shown) provided thereinside. Reference numerals 300a, 300b and 300c indicate chip-in wires of the Chip 250.

Electrical connections will next be described.

The PAD 260a and PAD 260b of the Chip 250 are respectively connected to the LEAD 270b by the bonding wires 280a and 280b. The PAD 260a is connected to the PAD 260d by the chip-in wire 300b. The PAD 260b is connected to the PAD 260c by the chip-in wire 300c. The PAD 260a and PAD 260b are connected to each other by the chip-in wire 300a. The ammeter 290 is connected between the PAD 260c and the PAD 260d.

While the PAD 260a and PAD 260b are connected to each other by the chip-in wire 300a in the semiconductor integrated circuit device shown in FIG. 10, they may not be connected to each other by the chip-in wire 300a. While the ammeter 290 is connected between the PAD 260d connected to the PAD 260a by the chip-in wire 300b and the PAD 260c connected to the PAD 260b by the chip-in wire 300c, it may be directly connected between the PAD 260a and the PAD 260b.

The operation of the semiconductor integrated circuit device will next be described.

Since the PAD 260a and PAD 260b of the Chip 250 are respectively connected to the LEAD 270b by the bonding wire 280a and the bonding wire 280b, the transfer of signals is performed between the PAD 260a and the LEAD 270b and between the PAD 260b and the LEAD 270b (when the LEAD 270b is of a signal LEAD) or the supply of power is performed therebetween (when the LEAD 270b is of a power LEAD).

A connection test executed by the ammeter 290 in the sixth embodiment is based on the following principle.

Firstly, when both the PAD 260a and PAD 260b are connected to the LEAD 270b, paths along which currents measured by the ammeter 290 flow, may include two paths:

a first path which extends from the PAD 260d to the PAD 260c via the chip-in wire 300b, the chip-in wire 300a (and unillustrated other chip-in wires between the PAD 260a and the PAD 260b) and the chip-in wire 300c, and a second path which extends from the PAD 260d to the PAD 260c via the chip-in wire 300b, the PAD 260a, the bonding wire 280a, the LEAD 270b, the bonding wire 280b, the PAD 260b and the chip-in wire 300c.

Next, when either or both of the PAD 260a and PAD 260b are disconnected from the LEAD 270b, only the first path referred to above is taken as the path along which the current measured by the ammeter 290 flows. Thus, as compared with the case where the currents flow in both the first path and the second path (i.e., where both the PAD 260a and PAD 260b are connected to the LEAD 270b), the resistance value of the path along which the current flows, increases and hence the value of the current is reduced.

Thus, a current value at the time that both the PAD 260a and PAD 260b are connected to the LEAD 270b, is regarded as a normal value. Further, when the current value is relatively lower than the normal value, the electrical connection between the PAD 260a and PAD 260b and the LEAD 270b is judged to have been cut off. The connection test is performed in this way.

The semiconductor integrated circuit device 6 according to the sixth embodiment as described above includes a semiconductor integrated circuit chip (Chip 250) provided with a plurality of PADs (PADs 260a–260d), a plurality of LEADs (LEADs 270a–270d) disposed around the semiconductor integrated circuit chip (Chip 250), and two bonding wires (280a and 280b) for respectively connecting one LEAD (LEAD 270b) of the plurality of LEADs (LEADs 270a–270d) to two PADs (PADs 260a and 260b) of the plurality of PADs (PADs 260a–260d).

Further, in the semiconductor integrated circuit device 6 according to the sixth embodiment, the semiconductor integrated circuit chip (Chip 250) includes PADs (PADs 260c and 260d) for measuring a current flowing between two PADs (PADs 260a and 260b) connected to one LEAD (LEAD 270b) by two bonding wires (280a and 280b) to thereby effect a connection test on the two bonding wires.

According to the sixth embodiment as described above, an advantageous effect is obtained in that since one LEAD (LEAD 270b) is wired to the two PADs (PADs 260a and 260b), the number of LEADs to be used can be reduced. Further, an advantageous effect is obtained in that since the PADs (PADs260c and 260d) for measuring the current flowing between the two PADs (PADs260a and 260b) connected to one LEAD (LEAD270b) to thereby effect the connection test on the two bonding wires are included in the semiconductor integrated circuit device, a connection test on whether both the PADs are being connected to its corresponding LEAD by bonding wires, can be carried out.

Seventh Embodiment

Figure 11:
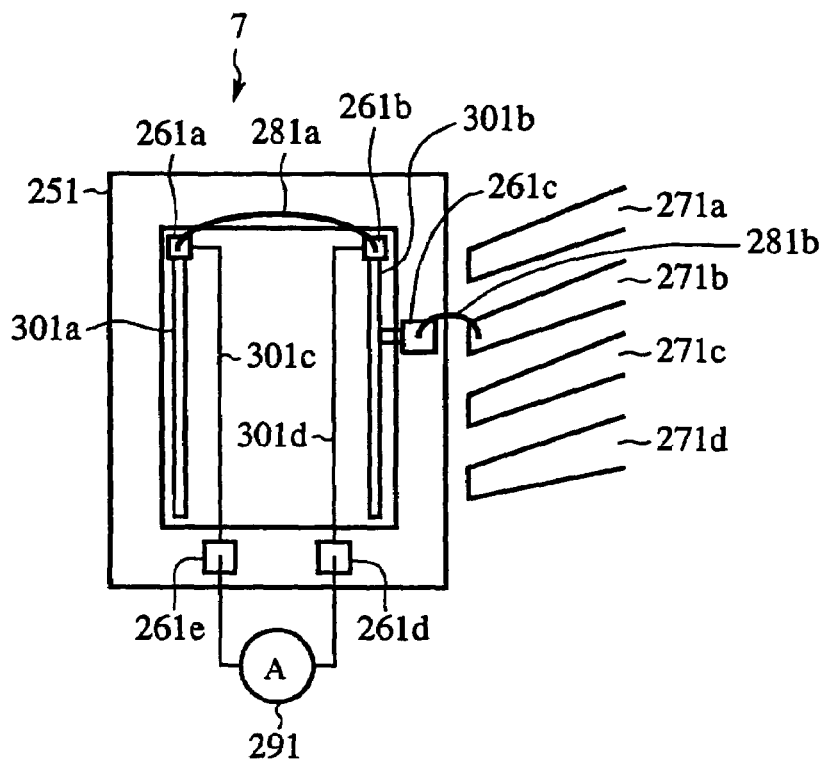
FIG. 11 is a plan view depicting a semiconductor integrated circuit device according to a seventh embodiment of the present invention.

FIG. 11 is a plan view showing a semiconductor integrated circuit device according to a seventh embodiment of the present invention. In FIG. 11, reference numeral 7 indicates a semiconductor integrated circuit device, and reference numeral 251 indicates a semiconductor integrated circuit chip (Chip), respectively. Reference numerals 261a–261e indicate pads (PADs) of the Chip 251, and reference numerals 271a–271d indicate leads (LEADs) disposed around the Chip 251, respectively. Reference numerals 281a and 281b indicate bonding wires respectively. Reference numeral 291 indicates an ammeter with a dc power supply (unillustrated) provided thereinside. Reference numerals 301a–301d indicate chip-in wires of the Chip251.

Electrical connections will next be explained.

The PAD 261c of the Chip 251 is connected to its corresponding LEAD 271b by the bonding wire 281b. The PAD 261a and the PAD 261b are respectively connected to the chip-in wire 301a and the chip-in wire 301b, and the PAD 261b is connected to its corresponding PAD 261c by the chip-in wire 301b. The PAD 261a and PAD 261b are connected to each other by the bonding wire 281a. The PAD 261d and PAD 261e are respectively connected to the PAD 261b and PAD 261a by the chip-in wire 301d and chip-in wire 301c. The ammeter 291 is connected between the PAD 261d and PAD 261e.

While the ammeter 291 is connected between the PAD 261d connected to the PAD 261b by the chip-in wire 301d and the PAD 261e connected to the PAD 261a by the chip-in wire 301c in the semiconductor integrated circuit device shown in FIG. 11, it may be directly connected between the PAD 261b and the PAD 261a.

The operation of the semiconductor integrated circuit device will next be-described.

The PAD 261c of the Chip251 is connected to its corresponding LEAD 271b by the bonding wire 281b, the PAD 261b is connected to its corresponding PAD 261c by the chip-in wire 301b, and the PAD 261a is connected to its corresponding PAD 261b by the bonding wire 281a. Thus, the transfer of a signal is performed between the PAD 261a and PAD 261b, and the LEAD 271b (when the LEAD 271b is of a signal LEAD) or the supply of power is performed therebetween (when the LEAD 271b is of a power LEAD). In FIG. 11, the chip-in wire 301a and chip-in wire 301b are shown as chip-in wires for a power supply, and the LEAD 271b is shown as a power LEAD, respectively.

A connection test executed by the ammeter 291 in the seventh embodiment is based on the following principle.

Firstly, when the PAD 261a and PAD 261b are connected to each other by the bonding wire 281a, paths along which currents measured by the ammeter 291 flow, may include two paths: a first path which extends from the PAD 261e to the PAD 261d via the chip-in wire 301c, the PAD 261a, the bonding wire 281a, the PAD 261b, and the chip-in wire 301d, and a second path which extends from the PAD 261e to the PAD 261d via the chip-in wire 301c, the PAD 261a, unillustrated other chip-in wires between the PAD 261a and the PAD 261b, the PAD 261b, and the chip-in wire 301d.

Next, when the PAD 261a and PAD 261b are not connected to each other by the bonding wire 281a, only the second path referred to above is taken as the path along which the current measured by the ammeter 291 flows. Thus, as compared with the case where the currents flow in both the first path and the second path (i.e., where both the PAD 261a and PAD 261b are connected to each other by the bonding wire 281a), the resistance value of the path along which the current flows, increases and hence the value of the current is reduced.

Thus, a current value at the time that both the PAD 261a and PAD 261b are connected to each other by the bonding wire 281a, is regarded as a normal value. Further, when the current value is relatively lower than the normal value, the electrical connection between the PAD 261a and the PAD 261b is judged to have been cut off. The connection test is performed in this way.

The semiconductor integrated circuit device 7 according to the seventh embodiment as described above includes a semiconductor integrated circuit chip (Chip 251) provided with a plurality of PADs (PADs 261a–261e), a plurality of LEADs (LEADs 271a–271d) disposed around the semiconductor integrated circuit chip (Chip 251), and a bonding wire (281a) for connecting between power supplies (chip-in wires 301a and 301b) lying within the semiconductor integrated circuit chip (Chip 251).

Further, in the semiconductor integrated circuit device 7 according to the seventh embodiment, the semiconductor integrated circuit chip (Chip 251) includes PADs (PADs 261d and 261e) for measuring a current flowing between the power supplies (chip-in wires 301a and 301d) lying within the semiconductor integrated circuit chip (Chip 251) to thereby effect a connection test on the bonding wire (281a) for connecting between the power supplies.

According to the seventh embodiment as described above, an advantageous effect is obtained in that since the bonding wire (bonding wire 281a) connects between the power supplies (chip-in wires 301a and 301b) lying within the semiconductor integrated circuit chip (Chip 251), power enhancement can be made between the power supplies, and the area of a power-supply wiring region can be reduced to diminish the area of the semiconductor integrated circuit chip. Further, an advantageous effect is obtained in that since the PADs (PADs 261d and 261e) for measuring the current flowing between the power supplies (chip-in wires 301a and 301d) lying within the semiconductor integrated circuit chip (Chip 251) to thereby effect the connection test on the bonding wire (bonding wire 281a) for connecting between the power supplies are included in the semiconductor integrated circuit chip, a connection test on whether the bonding wire is connecting between the power supplies, can be carried out.

Eighth Embodiment

Figure 12:
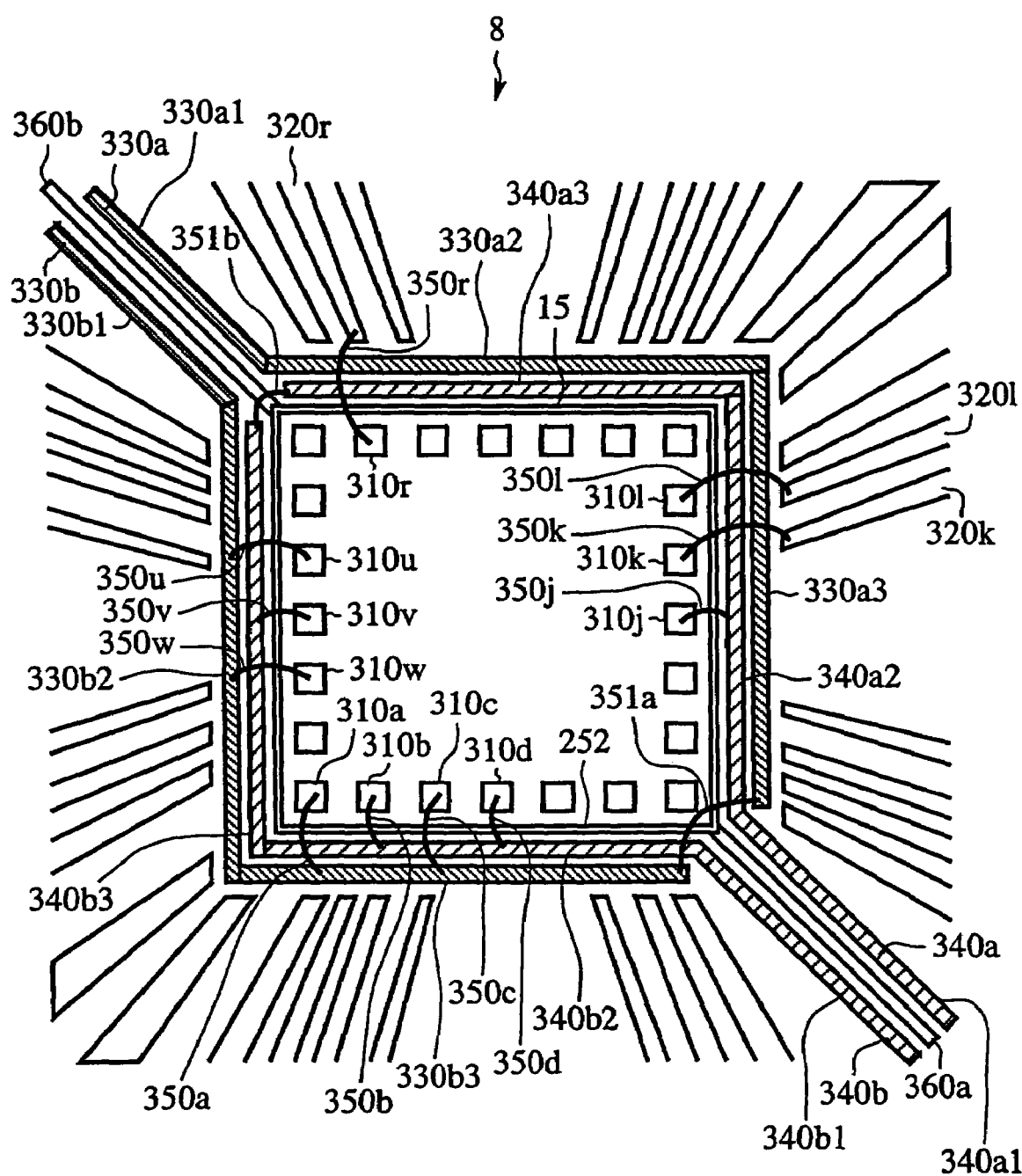
FIG. 12 is a plan view illustrating a semiconductor integrated circuit device according to an eighth embodiment of the present invention.

FIG. 12 is a plan view showing a semiconductor integrated circuit device according to an eighth embodiment of the present invention. In FIG. 12, reference numeral 8 indicates a semiconductor integrated circuit device, and reference numeral 15 indicates a bonding pad (bonding PAD), respectively. Reference numeral 252 indicates a semiconductor integrated circuit chip (Chip) disposed on the bonding PAD 15. Reference numerals 310a–310d, 310j–310l, 310r, and 310u–310w indicate pads (PADs) of the Chip 252. Reference numerals 320k, 320l and 320r indicate leads (LEADs) disposed around an array of the Chip 252 disposed on the bonding PAD 15. Reference numerals 330a and 330b respectively indicate power leads (VDD), reference numeral 330a1 indicates an outwardly-extending portion of the VDD 330a, reference numerals 330a2 and 330a3 respectively indicate portions of the VDD 330a, which extend along the periphery of the array of the Chip 252, reference numeral 330b1 indicates an outwardly-extending portion of the VDD 330b, and reference numerals 330b2 and 330b3 respectively indicate portions of the VDD 330b, which extend along the periphery of the array of the Chip 252. Reference numerals 340a and 340b respectively indicate ground leads (GND), reference numeral 340a1 indicates an outwardly-extending portion of the GND 340a, reference numerals 340a2 and 340a3 respectively indicate portions of the GND 340a, which extend along the periphery of the array of the Chip 252, reference numeral 340b1 indicates an outwardly-extending portion of the GND 340b, and reference numerals 340b2 and 340b3 respectively indicate portions of the GND 340b, which extend along the periphery of the array of the Chip 252. Reference numerals 350a–350d, 350j–350l, 350r, 350u–350w, 351a and 351b indicate bonding wires respectively. Reference numerals 360a and 360b respectively indicate bonding PAD fixing leads (LEADs) for fixing the bonding PAD 15.

Electrical connections will next be described.

The PADs 310a, 310c, 310u and 310w of the Chip 252 are respectively connected to the VDD 330b by means of the bonding wires 350a, 350c, 350u and 350w. The PADs 310b, 310d and 310v are respectively connected to the GND 340b by means of the bonding wires 350b, 350d and 350v. The PAD 310j is connected to the GND 340a by the bonding wire 350j. The PADs 310k, 310l and 310r are respectively connected to the LEADs 320k, 320l and 320r by means of the bonding wires 350k, 350l and 350r. The VDD 330a and VDD 330b are connected to each other by the bonding wire 351a. The GND 340a and GND 340b are connected to each other by the bonding wire 351b.

While both the VDD 330a and VDD 330b respectively have the portions extending along the periphery of the Chip 252 and the portions extending along the bonding PAD fixing LEAD 360b in the semiconductor integrated circuit device shown in FIG. 12, either one of the VDD 330a and VDD 330b may have only the portions extending along the periphery of the Chip252. Similarly, while both the GND 340a and GND 340b respectively have the portions extending along the periphery of the Chip 252 and the portions extending along the bonding PAD fixing LEAD 360a, either one of the GND 340a and GND 340b may have only the portions extending along the periphery of the Chip 252.

The operation of the semiconductor integrated circuit device will next be described.

Since the PADs 310k, 310l and 310r are respectively connected to the signal LEADs 320k, 320l and 320r, the transfer of signals is performed between theses PADs and LEADs respectively. Since the PADs 310a, 310c, 310u and 310w are connected to the VDD 330b, a source voltage is supplied to these PADs. Since the PADs 310b, 310d and 310v are connected to the GND 340b, and the PAD 310j is connected to the GND 340a, these PADs are respectively supplied with a ground potential.

As described above, the semiconductor integrated circuit device 8 according to the eighth embodiment has a semiconductor integrated circuit chip (Chip252) provided with a plurality of PADs (PADs 310a–310d, 310j–310l, 310r and 310u–310w), one or a plurality of LEADs (LEADs 320k, 320l and 320r, VDDs 330a and 330b, and GNDs 340a and 340b) disposed around the array of the semiconductor integrated circuit chip (Chip 252), and a plurality of bonding wires (bonding wires 350a–350d, 350j–350l, 350r and 350u–350w). At least one LEAD (VDD 330b, GND 340b) of the plurality of LEADs are connected to two or more PADs (PADs 310a, 310c, 310u and 310w) of the plurality of PADs by their corresponding bonding wires (bonding wires 310a, 310c, 310u and 310w) of the plurality of bonding wires.

Further, in the semiconductor integrated circuit device 8 according to the eighth embodiment, the LEAD (VDD 330b, GND 340b) connected to the two or more PADs includes portions (330b2, 330b3, 340b2 and 340b3) which extend along the periphery of the array of the semiconductor integrated circuit chip (Chip252).

According to the eighth embodiment as described above, an advantageous effect is obtained in that since at least one LEAD (VDD 330b, GND 340b) of the plurality of LEADs is connected to the two or more PADs (PADs 310a, 310c, 310u and 310w) of the plurality of PADs by their corresponding bonding wires (bonding wires 310a, 310c, 310u and 310*w*) of the plurality of bonding wires, the plurality of PADs lying within the semiconductor integrated circuit chip can be supplied with power.

Further, an advantageous effect is obtained in that since the LEAD (VDD 330*b*, GND 340*b*) connected to the two or more PADs includes the portions (330*b*2, 330*b*3, 340*b*2 and 340*b*3) which extend along the periphery of the array of the semiconductor integrated circuit chip (Chip 252), the power supply and ground can easily be connected to the plurality of PADs even from any orientations of the periphery of the semiconductor integrated circuit chip.

Ninth Embodiment

Figure 13:
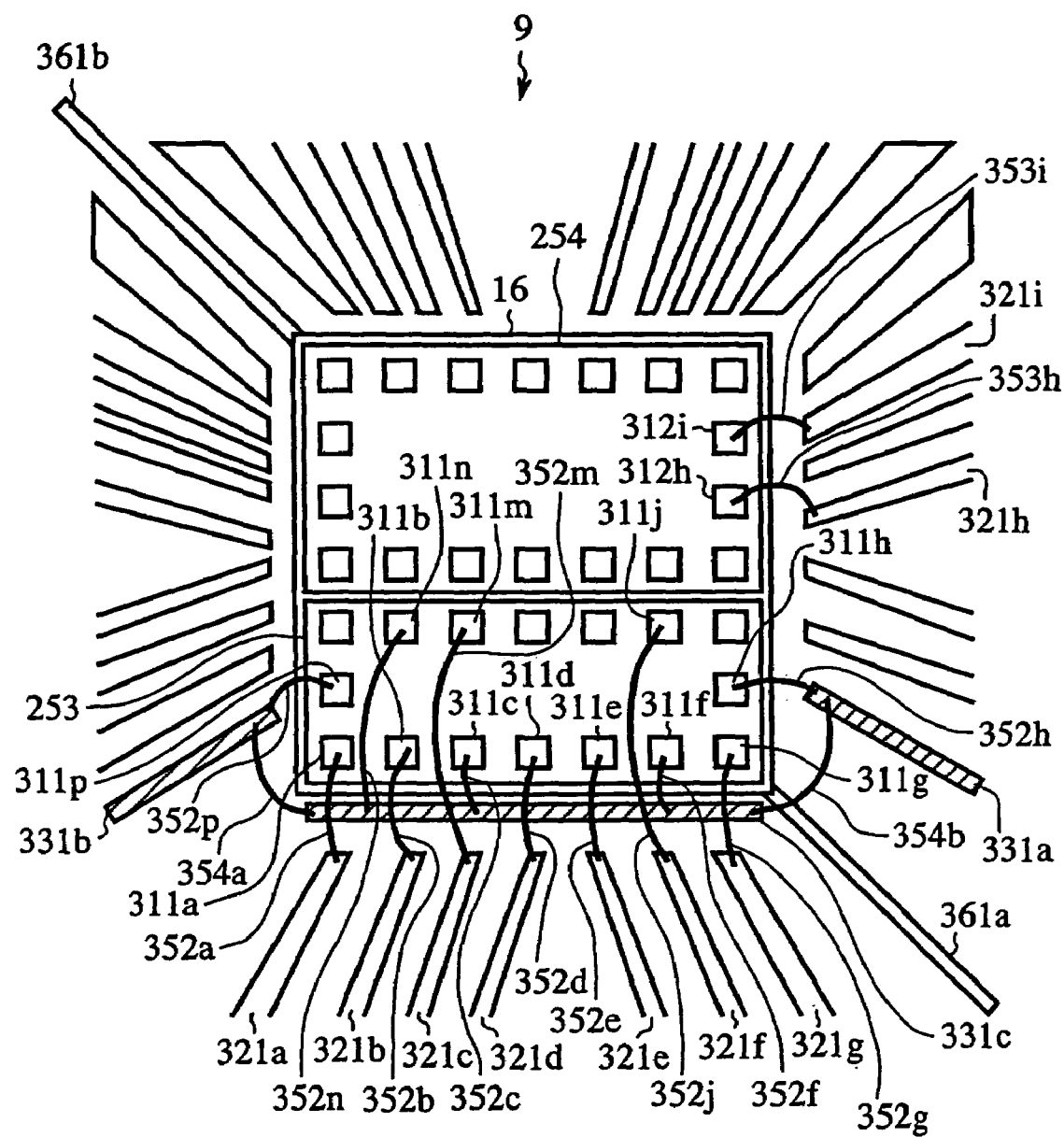
FIG. 13 is a plan view showing a semiconductor integrated circuit device according to a ninth embodiment of the present invention.

FIG. 13 is a plan view showing a semiconductor integrated circuit device according to a ninth embodiment of the present invention. In FIG. 13, reference numeral 9 indicates a semiconductor integrated circuit device, and reference numeral 16 indicates a bonding pad (bonding PAD), respectively. Reference numeral 253 indicates a semiconductor integrated circuit chip A (Chip A) disposed on the bonding PAD16, and reference numeral 254 indicates a semiconductor integrated circuit chip B (Chip B) disposed on the bonding PAD16, respectively. Reference numerals 311*a*–311*h*, 311*j*, 311*m*, 311*n*, and 311*p* indicate pads (PADs) of the Chip A253. Reference numerals indicate 312*h*, and 312*i* indicate pads (PADs) of the Chip B254. Reference numerals 321*a*–321*i* indicate leads (LEADs) disposed around arrays of the Chip A253 and Chip B254 disposed on the bonding PAD16. Reference numerals 331*a*, 331*b* and 331*c* respectively indicate power LEADs. Reference numerals 352*a*–352*h*, 352*j*, 352*m*, 352*n*, 352*p*, 353*h*, 353*i*, 354*a* and 354*b* indicate bonding wires respectively. Reference numerals 361*a* and 361*b* respectively indicate bonding PAD fixing leads (LEADs) for fixing the bonding PAD 16.

Electrical connections will next be described.

The PADs 311*a*, 311*b*, 311*d*, 311*e*, 311*g*, 311*j* and 311*m* of the Chip A253 are respectively connected to the LEADs 321*a*, 321*b*, 321*d*, 321*e*, 321*g*, 321*f* and 321*c* by the bonding wires 352*a*, 352*b*, 352*d*, 352*e*, 352*g*, 352*j* and 352*m*. The PADs 312*h* and 312*i* of the Chip B254 are respectively connected to the LEADs 321*h* and 321*i* by the bonding wires 353*h* and 353*i*. The PADs 311*c*, 311*f* and 311*n* of the Chip A253 are respectively connected to the power LEAD 331*c* by the bonding wires 352*c*, 352*f* and 352*n*. The PADs 311*h* and 311*p* of the Chip A253 are respectively connected to the power LEADs 331*a* and 331*b* by the bonding wires 352*h* and 352*p*.

While the power LEAD 331*c* has only a portion extending along the periphery of the Chip A253 in the semiconductor integrated circuit device shown in FIG. 13, it may further include two portions which extend along other LEADs toward the outside of the semiconductor integrated circuit device from both ends of the power LEAD 331*c*. A further LEAD including a portion extending along the periphery of the Chip A253 is further provided, and the power LEAD 331*c* may be used as a LEAD (VDD) for a source voltage. The further LEAD may be used as a LEAD (GND) for ground.

The operation of the semiconductor integrated circuit device will next be described.

Since the PADs 311*a*, 311*b*, 311*d*, 311*e*, 311*g*, 311*j* and 311*m* of the Chip A253, and the PADs 312*h* and 312*i* of the Chip B254 are respectively connected to the signal LEADs 321*a*, 321*b*, 321*d*, 321*e*, 321*g*, 321*f*, 321*c*, 321*h* and 321*i*, the transfer of signals is performed between these PADs and LEADs respectively. Since the PADs 311*c*, 311*f* and 311*n* are connected to the power LEAD 331*c*, and the power LEAD 331*c* is connected to the power LEADs 331*a* and 331*b* each connected to an external power supply, these PADs are respectively supplied with a source voltage. Since the PADs 311*h* and 311*p* are respectively connected to the power LEADs 331*a* and 331*b* each connected to the external power supply, these PADs are respectively supplied with the source voltage.

As described above, the semiconductor integrated circuit device 9 according to the ninth embodiment has semiconductor integrated circuit chips (Chip A253 and Chip B254) provided with a plurality of PADs (PADs 311*a*–311*h*, 311*j*, 311*m*, 311*n*, 311*p*, 312*h* and 312*i*), one or a plurality of LEADs (LEADs 321*a*–321*i* and 331*a*–331*c*) disposed around the arrays of the semiconductor integrated circuit chips (Chip A253 and Chip B254), and a plurality of bonding wires (352*a*–352*h*, 352*j*, 352*m*, 352*n*, 352*p*, 353*h*, 353*i*, 354*a* and 354*b*). At least one LEAD (LEAD331*c*) of the plurality of LEADs is connected to two or more PADs (PADs311*c*, 311*f* and 311*n*) of the plurality of PADs by their corresponding bonding wires (352*c*, 352*f* and 352*n*) of the plurality of bonding wires.

Further, in the semiconductor integrated circuit device 9 according to the ninth embodiment, the LEAD (LEAD 331*c*) connected to the two or more PADs includes the portion extending along the periphery of the array of the semiconductor integrated circuit chip and is connected to the LEADs (LEADs 331*a* and 331*b*) different from the LEAD connected to the two or more PADs, by the bonding wires (354*a* and 354*b*).

According to the ninth embodiment as described above, an advantageous effect is obtained in that since at least one LEAD (LEAD 331*c*) of the plurality of LEADs is connected to the two or more PADs (PADs 311*c*, 311*f* and 311*n*) of the plurality of PADs by their corresponding bonding wires (352*c*, 352*f* and 352*n*) of the plurality of bonding wires, the plurality of PADs lying within the semiconductor integrated circuit chip can be supplied with power.

Further, an advantageous effect is obtained in that since the LEAD (LEAD 331*c*) connected to the two or more PADs includes the portion extending along the periphery of the array of the semiconductor integrated circuit chip and is connected to the LEADs (LEADs 331*a* and 331*b*) different from the LEAD connected to the two or more PADs, by the bonding wires (354*a* and 354*b*), the plurality of PADs are respectively supplied with power from the LEADs directly non-connected to the external power supply, and the LEADs which have heretofore been used as the power LEADs, can be used as signal LEADs.

Tenth Embodiment

Figure 14:
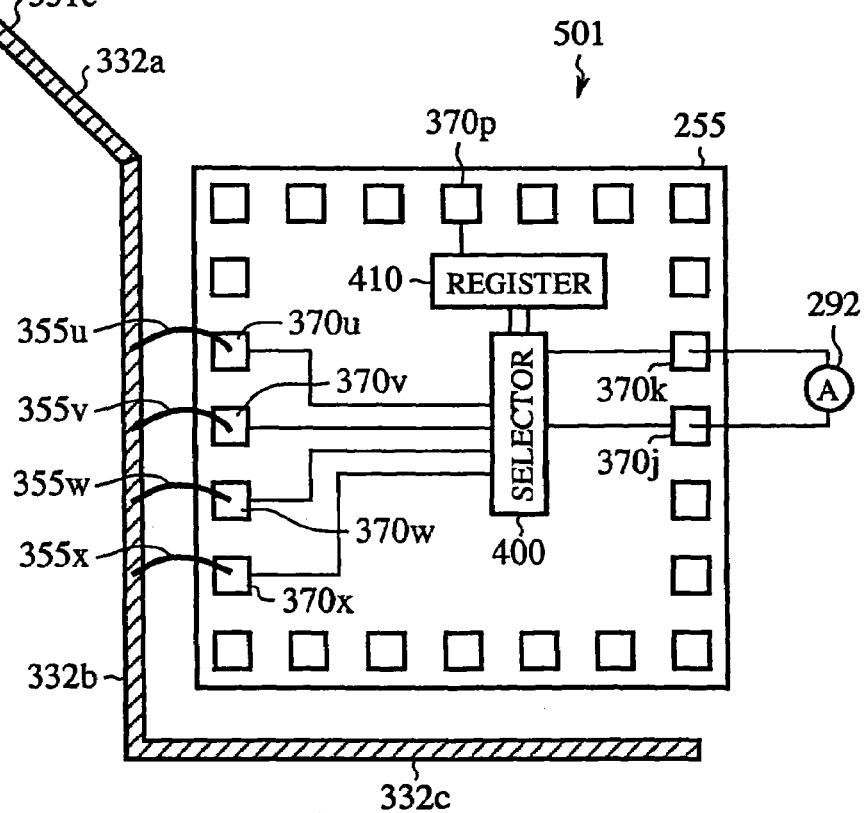
FIG. 14 is a plan view illustrating a semiconductor integrated circuit device according to a tenth embodiment of the present invention.
Figure 15:
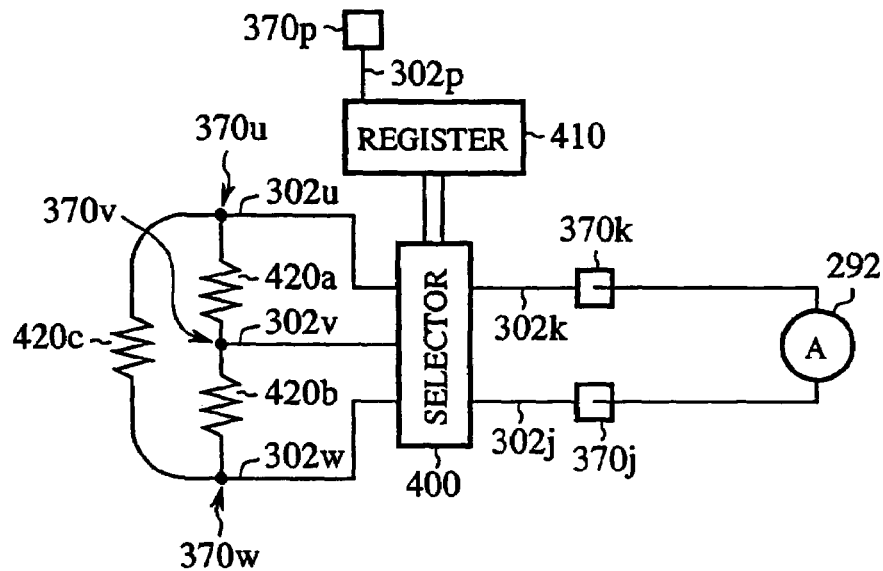
FIG. 15 is a diagrammatic illustration of the semiconductor integrated circuit device according to the tenth embodiment of the present invention.

FIG. 14 is a plan view showing a semiconductor integrated circuit device according to a tenth embodiment of the present invention. FIG. 15 is a diagrammatic illustration of the semiconductor integrated circuit device according to the tenth embodiment. In FIG. 14, reference numeral 501 indicates a semiconductor integrated circuit device, and reference numeral 255 indicates a semiconductor integrated circuit chip (Chip), respectively. Reference numeral 332 indicates a power lead (LEAD) disposed around an array of the Chip 255. Reference numeral 332*a* indicates an outwardly-extending portion of the power LEAD 332, and reference numerals 332*b* and 332*c* respectively indicate portions of the power LEAD 332, which extend along the periphery of the array of the Chip 255. Reference numerals 370*j*, 370*k*, 370*p* and 370*u*–370*x* indicate pads (PADs) of the Chip 255 respectively. Reference numerals 355*u*–355*x* indicate bonding wires respectively. Reference numerals 302*j*, 302*k*, 302*p* and 302*u*–302*x* indicate chip-in wires of the Chip 255 respectively. Reference numeral 292 indicates an ammeter with a dc power supply (not shown) provided thereinside. Reference numeral 400 indicates a selector, and reference numeral 410 indicates a register. In FIG. 15, reference numeral 420*a* indicates a resistor indicative of a resistance value between the PAD 370*u* and the PAD 370*v*, reference numeral 420*b* indicates a resistor indicative of a resistance value between the PAD 370*v* and the PAD 370*w*, and reference numeral 420*c* indicates a resistor indicative of a resistance value between the PAD 370*w* and the PAD370*u*, respectively.

Electrical connections will next be explained.

The PADs 370*u*, 370*v*, 370*w* and 370*x* are respectively connected to the power LEAD 332 by the bonding wires 355*u*, 355*v*, 355*w* and 355*x*. The PADs 370*u*, 370*v*, 370*w* and 370*x* are respectively connected to the selector 400 by the chip-in wires 302*u*, 302*v*, 302*w* and 302*x*. The PADs 370*j* and 370*k* are connected to the ammeter 292. The PADs 370*j* and 370*k* are connected to the selector 400 by the chip-in wires 302*j* and 302*k*. The PAD 370*p* is connected to the register 410 by the chip-in wire 302*p*.

In the semiconductor integrated circuit device shown in FIG. 14, another LEAD is provided in addition to the power LEAD 332. The power LEAD 332 may be used as a LEAD (VDD) for a source voltage, and another LEAD may be used as a LEAD (GND) for ground.

The operation of the semiconductor integrated circuit device will next be described.

Since the PADs 370*u*–370*x* of the Chip 255 are connected to the power LEAD 322, these PADs are respectively supplied with the source voltage. Since the PAD 370*p* is connected to the register 410, select data inputted from the PAD 370*p* is inputted to the register 410 where it is stored. Since the PADs 370*j* and 370*k* connected with the ammeter 292 are respectively connected to the selector 400 by the chip-in wire 302*j* and the chip-in wire 302*k*, a current that flows between the two PADs of the PADs 370*u*–370*x*, which are selected by the selector 400 based on the select data stored in the register 410, is measured by the ammeter 292.

A connection test according to the tenth embodiment is carried out in the following manner.

A description will be made of a case in which a connection test among three PADs of the PADs 370*u*, 370*v* and 370*w* is performed as shown in FIG. 15. The selector 400 selects, for example, the PAD 370*u* and PAD 370*v*, based on the select data stored in the register 410, and thereby connects the chip-in wire 302*u* connected with the PAD 370*u* to the chip-in wire 302*k* and connects the chip-in wire 302*v* connected with the PAD 370*v* to the chip-in wire 302*j*. Consequently, the ammeter 292 is connected to the PAD 370*u* and PAD 370*v* to thereby measure a current value corresponding to a resistance value (corresponding to the value represented by the resistor 420*a*) between the PAD 370*u* and PAD 370*v*. Thus, a current value at the time that the PAD 370*u* and PAD 370*v* are respectively connected to the power LEAD 332 by the bonding wire 355*u* and the bonding wire 355*v*, is regarded as a normal value. Further, when the current value is relatively lower than the normal value, the electrical connection between the PAD 370*u* and PAD 370*v* is judged to have been cut off. The connection test is performed in this way. A connection test is performed similarly even when a combination of other PADs is selected by the selector 400.

The semiconductor integrated circuit device 501 according to the tenth embodiment as described above includes a semiconductor integrated circuit chip (Chip 255) provided with a plurality of PADs (PADs 370*j*, 370*k*, 370*p* and 370*u*–370*x*), one or plural LEADs (power LEAD 332) disposed around an array of the semiconductor integrated circuit chip (Chip 255), and a plurality of bonding wires (bonding wires 355*u*–355*x*). At least one LEAD (power LEAD 332) of the plurality of LEADs is connected to two or more PADs (PADs 370*u*, 370*v*, 370*w* and 370*x*) of the plurality of PADs by the corresponding bonding wires (bonding wires 355*u*–355*x*) of the plurality of bonding wires.

In the semiconductor integrated circuit device 501 according to the tenth embodiment as well, the LEAD (power LEAD 332) connected to two or more PADs includes portions (332*b* and 332*c*) which extend along the array of the semiconductor integrated circuit chip (Chip 255).

Further, in the semiconductor integrated circuit device 501 according to the tenth embodiment, the semiconductor integrated circuit chip (Chip 255) includes PADs (PADs 370*j* and 370*k*) for measuring currents flowing between two or more PADs (PADs 370*u*–370*x*) connected to one LEAD and thereby effecting a connection test on the bonding wires (355*u*–355*x*) for connecting between the respective PADs.

Furthermore, in the semiconductor integrated circuit device 501 according to the tenth embodiment, the semiconductor integrated circuit chip (Chip 255) further includes a selector (400) for selecting two PADs to be measured.

According to the tenth embodiment as described above, an advantageous effect is obtained in that since at least one LEAD (power LEAD 332) of the plurality of LEADs is connected to the two or more PADs (PADs 370*u*, 370*v*, 370*w* and 370*x*) of the plurality of PADs by its corresponding bonding wires (bonding wires 355*u*–355*x*) of the plurality of bonding wires, the plurality of PADs lying within the semiconductor integrated circuit chip can be supplied with power.

An advantageous effect is also obtained in that since the LEAD (power LEAD 332) connected to the two or more PADs includes the portions (332*b* and 332*c*) extending along the periphery of the array of the semiconductor integrated circuit chip (Chip 255), the power supply and ground can easily be connected to the plurality of PADs even from any orientations of the periphery of the semiconductor integrated circuit chip.

Further, an advantageous effect is obtained in that since the semiconductor integrated circuit chip (Chip 255) includes the PADs (PADs 370*j* and 370*k*) for measuring currents flowing between the two or more respective PADs (PADs 370*u*–370*x*) connected to one LEAD and thereby effecting the connection test on the bonding wires (355*u*–355*x*) for connecting between the respective PADs, a connection test on whether the respective PADs are connected to the LEAD by their corresponding bonding wires, can be done.

Furthermore, an advantageous effect can be obtained in that since the semiconductor integrated circuit chip (Chip 255) further includes the selector (400) for selecting the two PADs to be measured, the PADs for carrying out the connection test are selected to allow a current measurement.

Eleventh Embodiment

Figure 16:
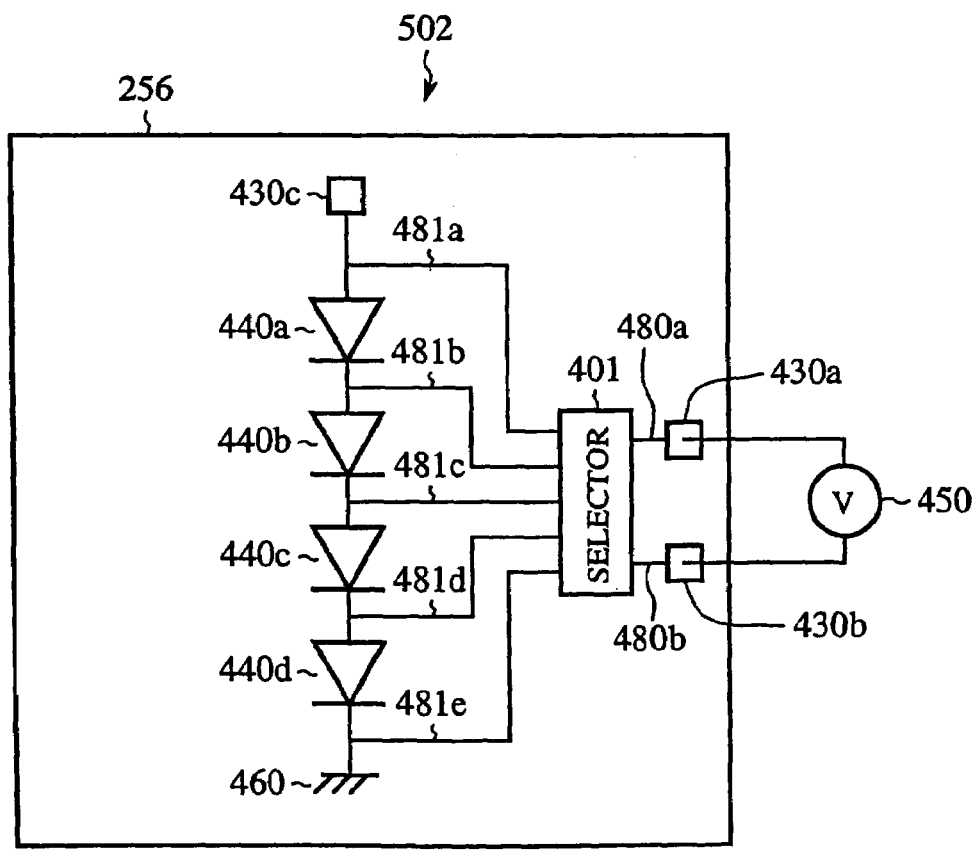
FIG. 16 is a plan view showing a semiconductor integrated circuit device according to an eleventh embodiment of the present invention.

FIG. 16 is a plan view showing a semiconductor integrated circuit device according to the eleventh embodiment of the present invention. In FIG. 16, reference numeral 502 indicates a semiconductor integrated circuit device, and reference numeral 256 indicates a semiconductor integrated circuit chip (Chip), respectively. Reference numerals 430a–430c indicate pads (PADs) of the Chip256, and reference numerals 480a, 480b and 481a–481e indicate chip-in wires, respectively. Reference numerals 440a–440d indicate diodes which constitute temperature sensors. Reference numeral 401 indicates a selector, and reference numeral 450 indicates a voltmeter, respectively. Reference numeral 460 indicates ground (GND).

Electrical connections will next be explained.

The diodes 440a–440d are connected in series. The anode of the diode 440a, the anode of the diode 440b, the anode of the diode 440c, the anode of the diode 440d, and the cathode of the diode 440d are respectively connected to the selector 401 by the chip-in wires 481a, 481b, 481c, 481d and 481e. The anode of the diode 440a is connected even to the PAD 430 c, and the cathode of the diode 440d is connected to the ground (GND) 460. An external power (not shown) for causing a current to flow through the diodes 440a–440d connected in series is connected to the PAD 430c. As shown in FIG. 16, the series-connected diodes 440a–440d are linearly disposed along one direction on the plane of the Chip256. The selector 401 is connected to the PAD 430a and PAD 430b by the chip-in wire 480a and the chip-in wire 480b, and the voltmeter 450 is connected between the PAD 430a and the PAD 430b. A register (not shown) is connected to the selector 401 and PADs (not shown) are connected to the register.

The operation of the semiconductor integrated circuit device will next be described.

In order to select any one of the diodes 440a–440d, based on select data stored in the register (not shown), the selector 401 connects a pair of the chip-in wires of the chip-in wires 481a–481e to the chip-in wire 480a and the chip-in wire 480b connected to the PAD 430a and PAD 430b. The voltmeter 450 measures a voltage between the anode and cathode of the diode connected with the pair of chip-in wires connected to the PAD 430a and PAD 430b via the selector 401. The temperature of the Chip 256 placed in the position where the diode selected by the selector 401 is disposed, can be recognized based on the voltage measured by the voltmeter 450. The selector 401 selects the continuously-connected two or more diodes of the diodes 440a–440d, based on the select data stored in the register (not shown). A whole voltage of the continuously-connected two or more diodes may be measured by the voltmeter 450.

As described above, the semiconductor integrated circuit device 502 according to the eleventh embodiment has a semiconductor integrated circuit chip (Chip 256) provided with a plurality of PADs (PADs 430a–430c), and a plurality of temperature sensors (440a–440d) for measuring a temperature distribution within the semiconductor integrated circuit chip (Chip 256).

Further, in the semiconductor integrated circuit device 502 according to the eleventh embodiment, the plurality of temperature sensors (440a–440d) are disposed within a semiconductor integrated circuit chip as an array comprising a plurality of temperature sensors connected in series.

Furthermore, in the semiconductor integrated circuit device 502 according to the eleventh embodiment, the semiconductor integrated circuit chip (Chip 256) further includes a selector (401) for selecting the temperature sensors (440a–440d).

According to the eleventh embodiment as described above, an advantageous effect is obtained in that since the plurality of temperature sensors (440a–440d) for measuring a temperature distribution within the semiconductor integrated circuit chip (Chip 256) are provided, the temperature distribution within the semiconductor integrated circuit chip (Chip 256) is recognized and thereby estimated, thereby making it possible to reduce the size of the semiconductor integrated circuit chip.

An advantageous effect is obtained in that since the plurality of temperature sensors (440a–440d) are disposed within the semiconductor integrated circuit chip as the array comprising the plurality of temperature sensors connected in series, a temperature distribution at a position along the array comprised of the temperature sensors can be recognized.

An advantageous effect is obtained in that since the semiconductor integrated circuit chip (Chip 256) further includes the selector (401) for selecting the temperature sensors (440a–440d), temperatures at positions where the respective temperature sensors are disposed, can be measured.

Twelfth Embodiment

Figure 17:
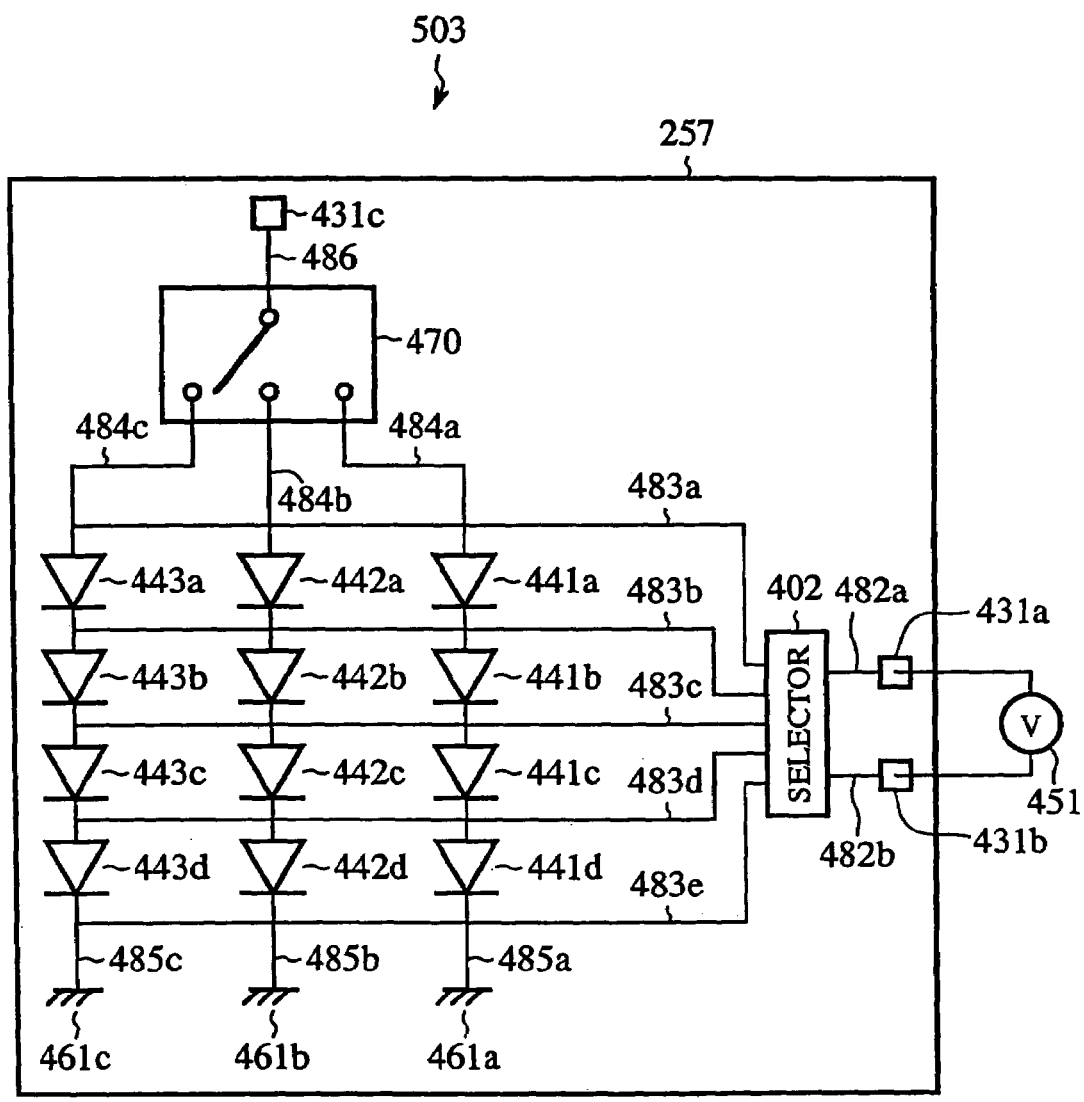
FIG. 17 is a plan view illustrating a semiconductor integrated circuit device according to a twelfth embodiment of the present invention.
Figure 18:
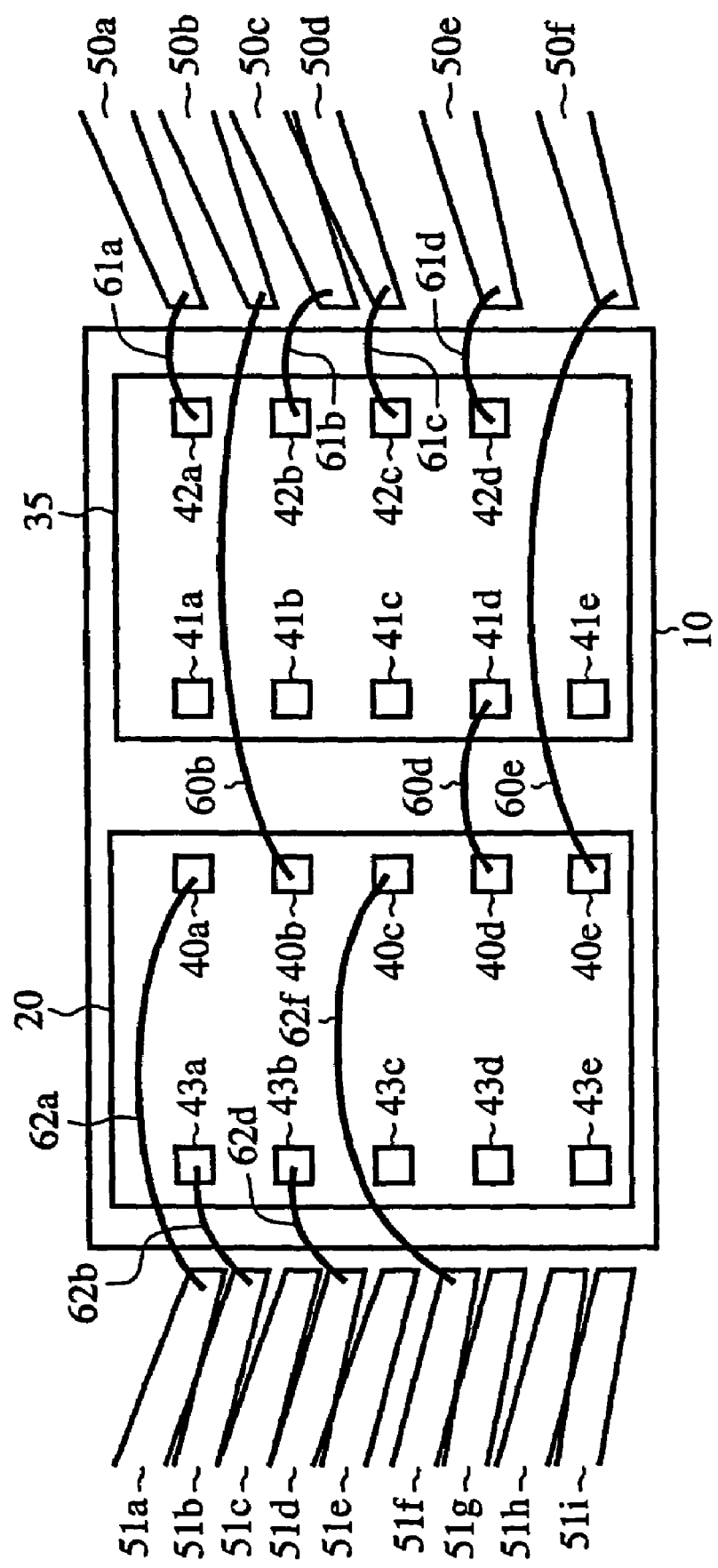
FIG. 18 is a plan view showing a semiconductor integrated circuit device (related art example 1) of a conventional SIP.
Figure 19:
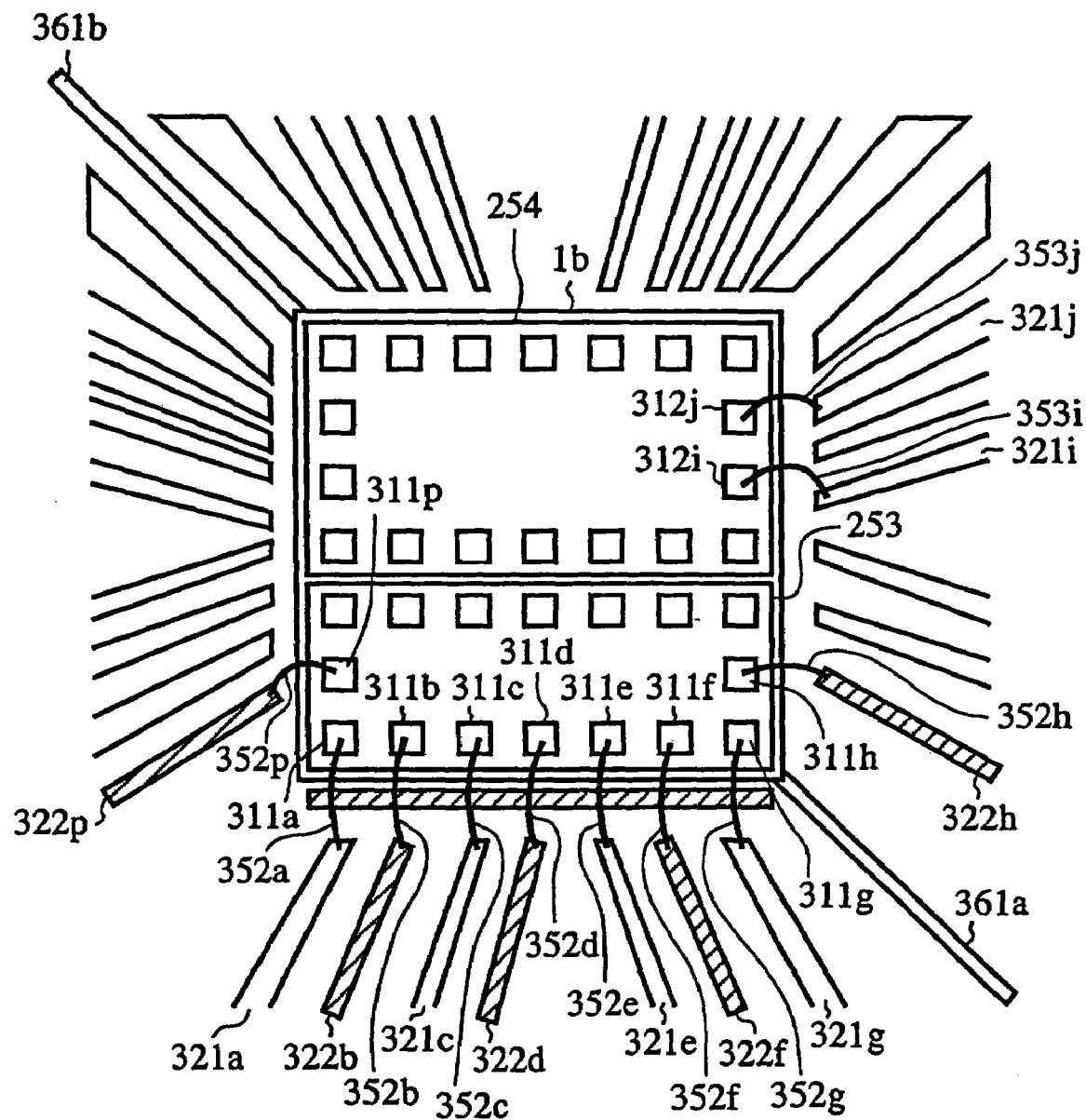
FIG. 19 is a plan view illustrating a semiconductor integrated circuit device (related art example 2) of a conventional SIP.

FIG. 17 is a plan view showing a semiconductor integrated circuit device according to a twelfth embodiment of the present invention. In FIG. 17, reference numeral 503 indicates a semiconductor integrated circuit device, and reference numeral 257 indicates a semiconductor integrated circuit chip (Chip), respectively. Reference numerals 431a–431c indicate pads (PADs) of the Chip257. Reference numerals 482a, 482b, 483a–481e, 484a–484c, 485a–485c and 486 indicate chip-in wires respectively. Reference numerals. 441a–441d, 442a–442d and 443a–443d indicate diodes which constitute temperature sensors. Reference numeral 402 indicates a selector, and reference numeral 451 indicates a voltmeter, respectively. Reference numerals 461a–461c indicate grounds (GNDs). Reference numeral 470 indicates a switch.

Electrical connections will next be described.

The diodes 441a–441d are connected in series. The anode of the diode 441a, the anode of the diode 441b, the anode of the diode 441c, the anode of the diode 441d and the cathode of the diode 441d are respectively connected to the selector 402 by the chip-in wires 483a, 483b, 483c, 483d and 483e. The diodes 442a–442d and the diodes 443a–443d are connected in series and connected to the selector 402 in a manner similar to the diodes 441a–441d. The anode of the diode 441a is connected even to the switch 470 by the chip-in wire 484a, and the cathode of the diode 441d is connected even to the ground (GND) 461a by the chip-in wire 485a. The anode of the diode 442a is connected even to the switch 470 by the chip-in wire 484b, and the cathode of the diode 442d is connected even to the ground (GND) 461b by the chip-in wire 485b. The anode of the diode 443a is connected even to the switch 470 by the chip-in wire 484c, and the cathode of the diode 443d is connected even to the ground (GND) 461c by the chip-in wire 485c. As shown in FIG. 17, the series-connected diodes 441a–441d, the series-connected diodes 442a–442d and the series-connected diodes 443a–443d respectively constitute arrays comprising a plurality of temperature sensors linearly disposed along one direction on the plane of the Chip257. The arrays comprising these plural temperature sensors are parallel-connected to one another and disposed along a direction orthogonal to the one direction on the plane of the Chip 257. The selector 402 is connected to the PAD431a and PAD431b by the chip-in wire 482a and the chip-in wire 482b, and the voltmeter 451 is connected between the PAD431a and the PAD431b. A register (not shown) is connected to the selector 402, and PADs (not shown) are connected to the register. The switch 470 is connected to the PAD431c by the chip-in wire 486. An external power supply (not shown) for allowing currents to flow through the diodes 441a through 441d, 442a through 442d and 443a through 443d connected in series is connected to the PAD431c.

The operation of the semiconductor integrated circuit device will next be described.

In order to select any one of the arrays 441a–441d, 442a–442d and 443a–443d comprising the series-connected diodes, based on select data stored in the register (not shown), the switch 470 connects any one of the chip-in wires 484a through 484c to the PAD 431c. In order to select the diode of any one of the arrays of the series-connected diodes, which has been selected by the switch 470, based on the select data stored in the register (not shown), the selector 402 connects a pair of chip-in wires of the chip-in wires 483a through 483e to the chip-in wire 482a and chip-in wire 482b connected to the PAD 431a and PAD 431b. The voltmeter 451 measures a voltage between the anode and cathode of the diode connected with the pair of chip-in wires connected to the PAD 431a and PAD431b via the selector 402. The temperature of the Chip257 placed in the position where the diode selected by the selector 402 is disposed, can be recognized based on the voltage measured by the voltmeter 451. The selector 402 selects the continuously-connected two or more diodes of the array of the series-connected diodes selected by the switch 470, based on the select data stored in the register (not shown). Then, a whole voltage across the continuously-connected two or more diodes may also be measured by the voltmeter 451.

As described above, the semiconductor integrated circuit device 503 according to the twelfth embodiment has a semiconductor integrated circuit chip (Chip 257) provided with a plurality of PADs (PADs 431a–431c), and a plurality of temperature sensors (441a–441d, 442a–442d and 443a–443d) for measuring a temperature distribution within the semiconductor integrated circuit chip (Chip 257).

Further, in the semiconductor integrated circuit device 503 according to the twelfth embodiment, the plurality of temperature sensors (441a–441d, 442a–442d and 443a–443d) are disposed within a semiconductor integrated circuit chip as plural arrays (441a–441d, 442a–442d and 443a–443d) in which arrays comprising a plurality of temperature sensors connected in series are parallel-connected to one another.

Furthermore, in the semiconductor integrated circuit device 503 according to the twelfth embodiment, the semiconductor integrated circuit chip (Chip 257) further includes a switch (470) for selecting arrays comprising temperature sensors and a selector (402) for selecting the temperature sensors of the respective arrays.

According to the twelfth embodiment as described above, an advantageous effect is obtained in that since the plurality of temperature sensors (441a–441d, 442a–442d and 443a–443d) for measuring a temperature distribution lying within the semiconductor integrated circuit chip (Chip 257) are provided, the temperature distribution within the semiconductor integrated circuit chip (Chip 257) is recognized and thereby estimated, thereby making it possible to reduce the size of the semiconductor integrated circuit chip.

An advantageous effect is obtained in that since the plurality of temperature sensors (441a–441d, 442a–442d and 443a–443d) are disposed within the semiconductor integrated circuit chip as the plural arrays (441a–441d, 442a–442d and 443a–443d) in which the arrays comprising the plurality of temperature sensors connected in series are parallel-connected to one another, temperature distributions at positions along the individuals of the arrays comprising the temperature sensors can be recognized.

An advantageous effect is obtained in that since the semiconductor integrated circuit chip (Chip257) further includes a switch (470) for selecting the arrays comprised of the temperature sensors, and the selector (402) for selecting the temperature sensors of the respective arrays, temperatures at positions where the respective temperature sensors are disposed, can be measured.

What is claimed is:

1. A semiconductor integrated circuit device, comprising:
    a first semiconductor integrated circuit chip having a first electrode pad and a second electrode pad thereon;
    a second semiconductor integrated circuit chip having a third electrode pad, a fourth electrode pad, a fifth electrode pad, a sixth electrode pad, a first wire electrically connecting the third electrode pad with the fourth electrode pad and a second wire electrically connecting the fifth electrode pad with the sixth electrode pad;
    first and second leads;
    a first bonding wire electrically connecting the first electrode pad with the third electrode pad;
    a second bonding wire electrically connecting the second electrode pad with the fifth electrode pad;
    a third bonding wire electrically connecting the fourth electrode pad with the first lead; and
    a fourth bonding wire electrically connecting the sixth electrode pad with the second lead,
    wherein the second semiconductor integrated circuit chip is arranged between the first semiconductor integrated circuit chip and the two leads,
    wherein the first, second, third and fourth bonding wires do not straddle the second semiconductor integrated circuit chip, and
    wherein the first wire crosses over the second wire.

2. The semiconductor device according to claim 1, wherein the first electrode pad is electrically connected with the first lead only via the second semiconductor integrated circuit chip and the first and the third bonding wires, and wherein the second electrode pad is electrically connected with the second lead only via the second semiconductor integrated circuit chip and the second and the fourth bonding wires.

3. The semiconductor device according to claim 1, wherein the second semiconductor integrated circuit chip includes interface functions between the first semiconductor integrated circuit chip and the first and the second leads.

* * * * *